United States Patent
de la Llera et al.

(10) Patent No.: US 9,245,716 B2
(45) Date of Patent: Jan. 26, 2016

(54) EDGE-CLAMPED AND MECHANICALLY FASTENED INNER ELECTRODE OF SHOWERHEAD ELECTRODE ASSEMBLY

(75) Inventors: Anthony de la Llera, Fremont, CA (US); Pratik Mankidy, Fremont, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 1015 days.

(21) Appl. No.: 12/903,412

(22) Filed: Oct. 13, 2010

(65) Prior Publication Data

US 2011/0083809 A1    Apr. 14, 2011

Related U.S. Application Data

(60) Provisional application No. 61/251,177, filed on Oct. 13, 2009.

(51) Int. Cl.
*H01L 21/3065* (2006.01)
*H01J 37/32* (2006.01)

(52) U.S. Cl.
CPC ....... *H01J 37/3244* (2013.01); *H01J 37/32091* (2013.01); *H01J 37/32532* (2013.01); *Y10T 29/49117* (2015.01)

(58) Field of Classification Search
CPC ............ H01J 37/32532; H01J 37/3244; H01J 37/32449; H01J 37/32541; C23C 16/45565; C23C 16/455; C30B 25/14
USPC .................................................. 156/345.34
See application file for complete search history.

(56) References Cited

U.S. PATENT DOCUMENTS

| | | |
|---|---|---|
| 4,585,920 A | 4/1986 | Hoog et al. |
| 4,612,077 A | 9/1986 | Tracy et al. |
| 4,908,095 A | 3/1990 | Kagatsume et al. |
| 5,074,456 A | 12/1991 | Degner et al. |
| 5,200,016 A | 4/1993 | Namose |
| 5,356,515 A | 10/1994 | Tahara et al. |
| 5,423,936 A | 6/1995 | Tomita et al. |
| D363,464 S | 10/1995 | Fukasawa |
| 5,500,256 A | 3/1996 | Watabe |

(Continued)

FOREIGN PATENT DOCUMENTS

| | | |
|---|---|---|
| JP | 56-087667 A1 | 7/1981 |
| JP | 07-066180 A | 3/1995 |

(Continued)

OTHER PUBLICATIONS

Commonly owned U.S. Appl. No. 61/036,862, filed Mar. 14, 2008.

(Continued)

*Primary Examiner* — Gordon R Baldwin
*Assistant Examiner* — Aiden Lee
(74) *Attorney, Agent, or Firm* — Buchanan, Ingersoll & Rooney PC

(57) ABSTRACT

An inner electrode of a showerhead electrode assembly useful for plasma etching includes features providing improved positioning accuracy and reduced warping, which leads to enhanced uniformity of plasma processing rate. The assembly can include a thermal gasket set and fasteners such as bolts or cam locks located on a radius of ¼ to ½ the radius of the inner electrode. A method of assembling the inner electrode and gasket set to a supporting member is also provided.

12 Claims, 21 Drawing Sheets

(56) References Cited

U.S. PATENT DOCUMENTS

| | | |
|---|---|---|
| 5,534,751 A | 7/1996 | Lenz et al. |
| 5,569,356 A | 10/1996 | Lenz et al. |
| 5,589,002 A | 12/1996 | Su |
| 5,590,975 A | 1/1997 | Horntvedt |
| 5,593,540 A | 1/1997 | Tomita et al. |
| 5,624,498 A | 4/1997 | Lee et al. |
| 5,740,009 A | 4/1998 | Pu et al. |
| 5,746,875 A | 5/1998 | Maydan et al. |
| 5,766,364 A | 6/1998 | Ishida et al. |
| 5,792,269 A | 8/1998 | Deacon et al. |
| D411,516 S | 6/1999 | Imafuku et al. |
| D412,513 S | 8/1999 | Ooyabu |
| 5,959,409 A | 9/1999 | Dornfest et al. |
| 5,993,597 A | 11/1999 | Saito et al. |
| 5,997,649 A | 12/1999 | Hillman |
| D420,022 S | 2/2000 | Burkhart et al. |
| 6,024,799 A | 2/2000 | Chen et al. |
| 6,036,782 A | 3/2000 | Tanaka et al. |
| 6,039,836 A | 3/2000 | Dhindsa et al. |
| 6,050,216 A | 4/2000 | Szapucki et al. |
| 6,050,506 A | 4/2000 | Guo et al. |
| D425,919 S | 5/2000 | Burkhart et al. |
| 6,079,356 A | 6/2000 | Umotoy et al. |
| 6,086,710 A | 7/2000 | Miyashita et al. |
| 6,110,287 A | 8/2000 | Arai et al. |
| 6,110,556 A | 8/2000 | Bang et al. |
| 6,132,512 A | 10/2000 | Horie et al. |
| 6,170,432 B1 | 1/2001 | Szapucki et al. |
| 6,173,673 B1 | 1/2001 | Golovato et al. |
| 6,200,415 B1 | 3/2001 | Maraschin |
| 6,206,972 B1 | 3/2001 | Dunham |
| D441,348 S | 5/2001 | Todd et al. |
| 6,228,208 B1 | 5/2001 | Lill et al. |
| 6,237,528 B1 | 5/2001 | Szapucki et al. |
| 6,245,192 B1 * | 6/2001 | Dhindsa et al. .......... 156/345.34 |
| 6,302,964 B1 | 10/2001 | Umotoy et al. |
| 6,368,450 B2 | 4/2002 | Hayashi |
| 6,389,677 B1 | 5/2002 | Lenz |
| 6,432,261 B2 | 8/2002 | Watanabe et al. |
| 6,444,037 B1 | 9/2002 | Frankel et al. |
| 6,461,435 B1 | 10/2002 | Littau et al. |
| 6,477,980 B1 | 11/2002 | White et al. |
| 6,495,233 B1 | 12/2002 | Shmurun et al. |
| 6,506,686 B2 | 1/2003 | Masuda et al. |
| 6,550,126 B1 | 4/2003 | Szettella et al. |
| 6,553,932 B2 | 4/2003 | Liu et al. |
| 6,558,506 B1 | 5/2003 | Freeman et al. |
| 6,586,886 B1 | 7/2003 | Katz et al. |
| 6,653,734 B2 | 11/2003 | Flanner et al. |
| 6,723,202 B2 | 4/2004 | Nagaiwa et al. |
| D490,450 S | 5/2004 | Hayashi et al. |
| 6,753,498 B2 | 6/2004 | Sirkis et al. |
| D493,873 S | 8/2004 | Hayashi |
| 6,786,175 B2 | 9/2004 | Dhindsa et al. |
| 6,818,096 B2 * | 11/2004 | Barnes et al. ........... 156/345.43 |
| 6,827,815 B2 * | 12/2004 | Hytros et al. ........... 156/345.33 |
| 6,872,258 B2 | 3/2005 | Park et al. |
| 6,899,786 B2 | 5/2005 | Senzaki et al. |
| 6,936,135 B2 | 8/2005 | Antolik |
| 6,942,753 B2 | 9/2005 | Choi et al. |
| 7,083,702 B2 | 8/2006 | Blonigan et al. |
| 6,391,787 B1 | 9/2006 | Dhindsa et al. |
| 7,159,537 B2 | 1/2007 | Wickramanayaka et al. |
| 7,166,200 B2 | 1/2007 | Saigusa et al. |
| 7,196,283 B2 | 3/2007 | Buchberger, Jr. et al. |
| 7,270,713 B2 | 9/2007 | Blonigan et al. |
| 7,296,534 B2 | 11/2007 | Fink |
| 2001/0000104 A1 | 4/2001 | Li et al. |
| 2002/0048963 A1 | 4/2002 | Campbell et al. |
| 2002/0127853 A1 * | 9/2002 | Hubacek et al. ............. 438/689 |
| 2002/0139479 A1 | 10/2002 | Antolik |
| 2002/0179245 A1 | 12/2002 | Masuda et al. |
| 2003/0127806 A1 | 7/2003 | Belchuk |
| 2003/0185729 A1 | 10/2003 | Ko et al. |
| 2004/0074609 A1 | 4/2004 | Fischer et al. |
| 2004/0108301 A1 | 6/2004 | Hao et al. |
| 2004/0173313 A1 | 9/2004 | Beach |
| 2005/0056218 A1 | 3/2005 | Sun et al. |
| 2005/0116427 A1 | 6/2005 | Seidel et al. |
| 2005/0133160 A1 | 6/2005 | Kennedy et al. |
| 2005/0150456 A1 | 7/2005 | Senzaki et al. |
| 2005/0241765 A1 | 11/2005 | Dhindsa et al. |
| 2005/0276928 A1 | 12/2005 | Okumura et al. |
| 2006/0000803 A1 | 1/2006 | Koshiishi et al. |
| 2006/0016559 A1 | 1/2006 | Kobayashi et al. |
| 2006/0037701 A1 | 2/2006 | Koshiishi et al. |
| 2006/0042754 A1 | 3/2006 | Yoshida et al. |
| 2006/0043067 A1 | 3/2006 | Kadkhodayan et al. |
| 2006/0066247 A1 | 3/2006 | Koshiishi et al. |
| 2006/0075969 A1 | 4/2006 | Fischer |
| 2006/0090704 A1 | 5/2006 | Ide et al. |
| 2006/0108069 A1 | 5/2006 | Gernert |
| 2006/0207502 A1 | 9/2006 | Dhindsa et al. |
| 2006/0236934 A1 | 10/2006 | Choi et al. |
| 2006/0283551 A1 | 12/2006 | Son |
| 2006/0283552 A1 | 12/2006 | Rogers |
| 2006/0288934 A1 * | 12/2006 | Takahashi et al. ............ 118/715 |
| 2007/0022954 A1 * | 2/2007 | Iizuka et al. ................. 118/724 |
| 2007/0032081 A1 | 2/2007 | Chang et al. |
| 2007/0044716 A1 | 3/2007 | Tetsuka et al. |
| 2007/0068629 A1 | 3/2007 | Shih et al. |
| 2007/0131350 A1 | 6/2007 | Ricci et al. |
| 2007/0181868 A1 | 8/2007 | Fujiwara et al. |
| 2007/0187038 A1 * | 8/2007 | Ren et al. ................. 156/345.43 |
| 2007/0215580 A1 | 9/2007 | Koshiishi et al. |
| 2007/0235660 A1 | 10/2007 | Hudson |
| 2007/0256786 A1 * | 11/2007 | Zhou et al. ............... 156/345.34 |
| 2007/0284045 A1 | 12/2007 | Fischer et al. |
| 2007/0284246 A1 | 12/2007 | Keii et al. |
| 2008/0087641 A1 | 4/2008 | La Llera et al. |
| 2008/0090417 A1 | 4/2008 | La Llera et al. |
| 2008/0099120 A1 | 5/2008 | Larson et al. |
| 2008/0141941 A1 | 6/2008 | Augustino et al. |
| 2008/0227301 A1 | 9/2008 | Fang et al. |
| 2008/0308228 A1 | 12/2008 | Stevenson et al. |
| 2008/0308229 A1 | 12/2008 | Patrick et al. |
| 2009/0081878 A1 | 3/2009 | Dhindsa |
| 2009/0095220 A1 | 4/2009 | Meinhold et al. |
| 2009/0095424 A1 * | 4/2009 | Bettencourt et al. ...... 156/345.34 |
| 2009/0163034 A1 | 6/2009 | Larson et al. |
| 2009/0223932 A1 | 9/2009 | Hida et al. |
| 2009/0236040 A1 | 9/2009 | Patrick et al. |
| 2010/0000683 A1 | 1/2010 | Kadkhodayan et al. |
| 2010/0003824 A1 | 1/2010 | Kadkhodayan et al. |
| 2010/0003829 A1 | 1/2010 | Patrick et al. |
| 2010/0038033 A1 | 2/2010 | Hardin et al. |
| 2010/0252197 A1 | 10/2010 | Kadkhodayan et al. |
| 2010/0261354 A1 | 10/2010 | Bettencourt et al. |

FOREIGN PATENT DOCUMENTS

| | | |
|---|---|---|
| JP | 09-013172 A | 1/1997 |
| JP | 09-245994 | 9/1997 |
| JP | 2001085398 A | 3/2001 |
| JP | 2002-198353 A | 7/2002 |
| WO | WO2009/114175 A2 | 9/2009 |

OTHER PUBLICATIONS

Commonly owned Utility U.S. Appl. No. 11/896,375, filed Aug. 31, 2007 now U.S. Publication No. 2008/0308228A1, published Dec. 18, 2008.

Commonly owned Utility U.S. Appl. No. 12/216,526, filed Jul. 7, 2008 now U.S. Publication No. 2010/0003824A1, published Jan. 7, 2010.

Commonly owned Utility U.S. Appl. No. 12/216,524, filed Jul. 7, 2008 now U.S. Publication No. 2010/0003829A1, published Jan. 7, 2010.

Commonly owned Utility U.S. Appl. No. 12/216,525, filed Jul. 7, 2008 now U.S. Publication No. 2010/0000683A1, published Jan. 7, 2010.

(56) References Cited

OTHER PUBLICATIONS

Commonly owned Utility U.S. Appl. No. 12/421,845, filed Apr. 10, 2009, now U.S. Publication No. 2010/0261354A1, published Oct. 14, 2010.
Commonly owned Utility U.S. Appl. No. 12/419,878, filed Apr. 7, 2009, now U.S. Publication No. 2010/0252197, published Oct. 7, 2010.
Commonly Owned Utility U.S. Appl. No. 12/875,869, filed Sep. 3, 2010.
Commonly Owned Utility U.S. Appl. No. 12/884,269, filed Sep. 17, 2010.
Commonly Owned Utility U.S. Appl. No. 12/872,980, filed Aug. 31, 2010.
Commonly Owned Utility U.S. Appl. No. 12/872,982, filed Aug. 31, 2010.
Commonly Owned Utility U.S. Appl. No. 12/872,984, filed Aug. 31, 2010.
Official Action dated Jan. 22, 2010 for Chinese Patent Appln. No. 201020114128.8.
International Search Report and Written Opinion mailed Feb. 24, 2010 for PCT/US2009/003953.
Search and Examination Report dated Mar. 28, 2012 for Singapore Appln. No. 201007631-3.

\* cited by examiner

US 9,245,716 B2

1

EDGE-CLAMPED AND MECHANICALLY FASTENED INNER ELECTRODE OF SHOWERHEAD ELECTRODE ASSEMBLY

This application claims priority under 35 U.S.C. §119 to U.S. Provisional Application No. 61/251,177 entitled EDGE-CLAMPED AND MECHANICALLY FASTENED INNER ELECTRODE OF SHOWERHEAD ELECTRODE ASSEMBLY, filed Oct. 13, 2009, the entire content of which is hereby incorporated by reference.

BACKGROUND

Disclosed herein is a showerhead electrode assembly of a plasma processing chamber in which semiconductor components can be manufactured. The fabrication of an integrated circuit chip typically begins with a thin, polished slice of high-purity, single crystal semiconductor material substrate (such as silicon or germanium) called a "substrate." Each substrate is subjected to a sequence of physical and chemical processing steps that form the various circuit structures on the substrate. During the fabrication process, various types of thin films may be deposited on the substrate using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor substrate, the unique electrical properties of semiconductors are produced by substituting selected impurities into the semiconductor crystal lattice using a process called doping. The doped silicon substrate may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

SUMMARY

A showerhead electrode assembly for a plasma reaction chamber used in semiconductor substrate processing includes an inner electrode mechanically attached to a backing plate by a clamp ring and threaded fasteners such as a plurality of bolts or cam locks. The threaded fasteners and the clamp ring provide laterally spaced points of support, improve thermal contact with the backing plate and reduce warping of the inner electrode during operation of the plasma reaction chamber. The inner electrode has on its mounting surface a plurality of gas injection holes arranged in at least one concentric row, a plurality of unthreaded blind holes configured to receive alignment pins, an annular groove configured to receive an alignment ring, and a plurality of threaded blind holes configured to receive the threaded fasteners such as bolts or a plurality of threaded sockets that hold spring biased studs engageable with rotatable cam shafts mounted in the backing plate. A set of gaskets is sandwiched between the inner electrode and the backing plate and between an outer electrode and the backing plate to provide thermal and electrical contact and eliminate rubbing contact therebetween. The gaskets have holes and/or cutouts aligned with alignment pins inserted in the inner electrode during assembly. The alignment pins ensure accurate positioning of the gaskets relative to the inner electrode. The gaskets also have holes and/or cutouts aligned with the threaded blind holes, and gas injection holes on the inner electrode.

DETAILED DESCRIPTION

A plasma reaction chamber typically consists of a vacuum chamber with an upper electrode assembly and a lower electrode assembly positioned therein. A substrate (usually a semiconductor) to be processed is covered by a suitable mask and placed directly on the lower electrode assembly. A process gas such as $CF_4$, $CHF_3$, $CClF_3$, HBr, $Cl_2$, $SF_6$ or mixtures thereof is introduced into the chamber with gases such as $O_2$, $N_2$, He, Ar or mixtures thereof. The chamber is maintained at a pressure typically in the millitorr range. The upper electrode assembly is provided with gas injection hole(s), which permit the gas to be uniformly dispersed through the upper electrode assembly into the chamber. One or more radio-frequency (RF) power supplies transmit RF power into the vacuum chamber and dissociate neutral process gas molecules into a plasma. Highly reactive radicals in the plasma are forced towards the substrate surface by an electrical field between the upper and lower electrodes. The surface of the substrate is etched or deposited on by chemical reaction with the radicals. The upper electrode assembly can include an inner electrode attached to a backing plate made of a different material from the inner electrode. The inner electrode is heated by the plasma and/or a heater arrangement during operation and may warp, which can adversely affect uniformity of processing rate across the substrate. In addition, differential thermal expansion of the inner electrode and the backing plate can lead to rubbing therebetween during repeated thermal cycles. Rubbing can produce particulate contaminants that degrade the device yield from the substrate.

To reduce warping of the inner electrode, described herein is a showerhead electrode assembly including a plurality of threaded fasteners such as bolts or cam locks engaged with the interior of a mounting surface of the inner electrode and a clamp ring around the edge of the inner electrode. The bolts or cam locks and clamp ring fasten the inner electrode to the backing plate at a plurality of positions distributed across the inner electrode.

Figure 1A:
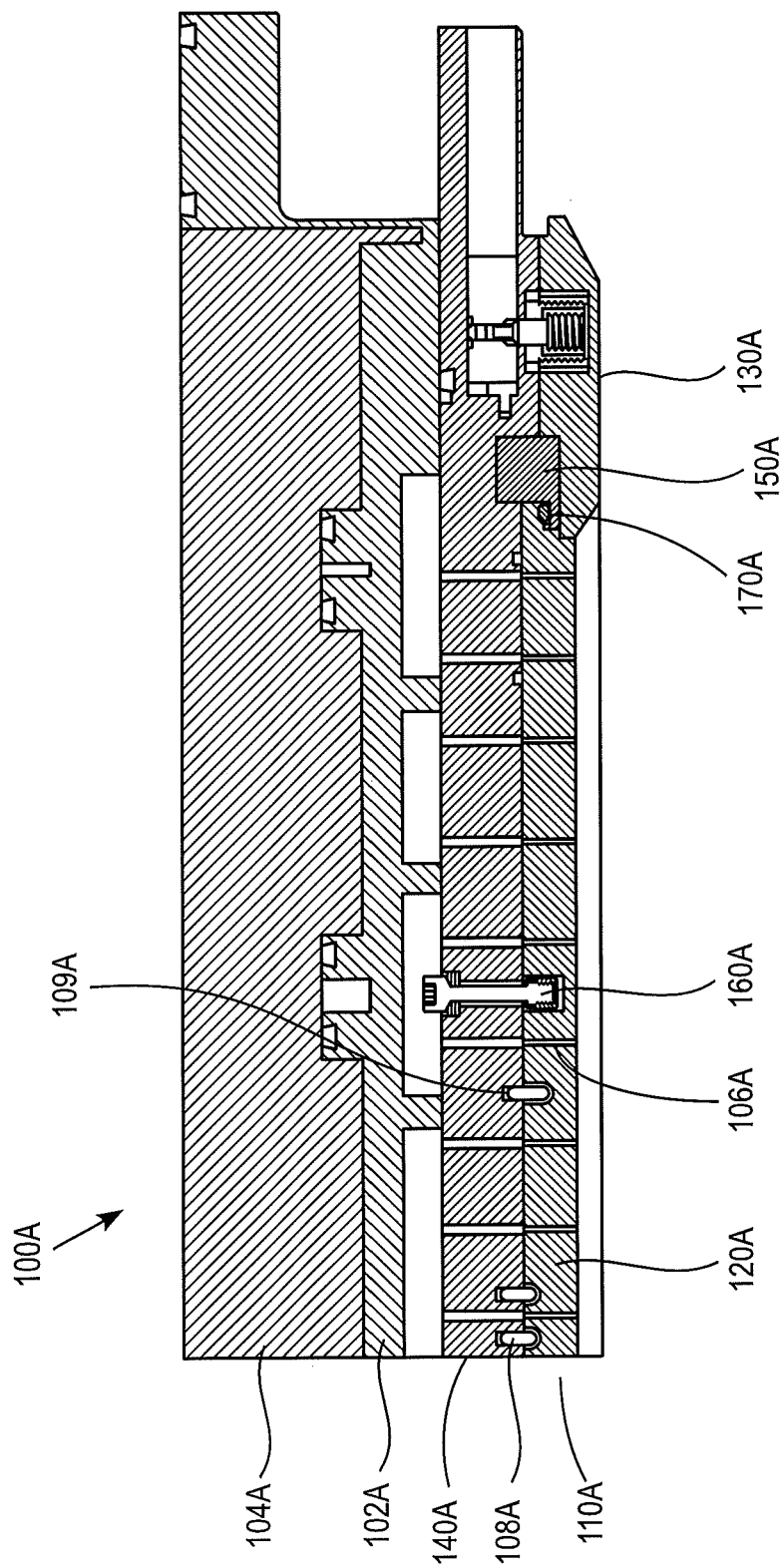
FIG. 1A shows a partial cross-sectional view of a showerhead electrode assembly for a capacitively coupled plasma reaction chamber, according to one embodiment.

FIG. 1A shows a partial cross-sectional view of a portion of a showerhead electrode assembly 100A of a plasma reaction chamber for etching semiconductor substrates. As shown in FIG. 1A, the showerhead electrode assembly 100A includes an upper electrode 110A, and a backing plate 140A. The assembly 100A also includes a thermal control plate 102A, a temperature controlled upper plate (top plate) 104A having liquid flow channels (not shown) therein. The upper electrode 110A preferably includes an inner electrode 120A, and an outer electrode 130A. The inner electrode 120A may be made of a conductive high purity material such as single crystal silicon, polycrystalline silicon, silicon carbide or other suitable material. The inner electrode 120A is a consumable part which must be replaced periodically. The backing plate 140A is mechanically secured to the inner electrode 120A and the outer electrode 130A with mechanical fasteners described below.

The showerhead electrode assembly 100A as shown in FIG. 1A is typically used with an electrostatic chuck (not shown) forming part of a flat lower electrode assembly on which a substrate is supported spaced 1 to 5 cm below the upper electrode 110A. An example of such a plasma reaction chamber is a parallel plate type reactor, such as the Exelan™ dielectric etch systems, made by Lam Research Corporation of Fremont, Calif. Such chucking arrangements provide temperature control of the substrate by supplying backside helium (He) pressure, which controls the rate of heat transfer between the substrate and the chuck.

During use, process gas from a gas source is supplied to the inner electrode 120A through one or more passages in the upper plate 104A which permit process gas to be supplied to a single zone or multiple zones above the substrate.

The inner electrode 120A is preferably a planar disk or plate. The inner electrode 120A can have a diameter smaller than, equal to, or larger than a substrate to be processed, e.g., up to 300 mm, if the plate is made of single crystal silicon, which is the diameter of currently available single crystal silicon material used for 300 mm substrates. For processing 300 mm substrates, the outer electrode 130A is adapted to expand the diameter of the inner electrode 120A from about 12 inches to about 17 inches (as used herein, "about" refers to ±10%). The outer electrode 130A can be a continuous member (e.g., a single crystal silicon, polycrystalline silicon, silicon carbide or other suitable material in the form of a ring) or a segmented member (e.g., 2-6 separate segments arranged in a ring configuration, such as segments of single crystal silicon, polycrystalline silicon, silicon carbide or other material). To supply process gas to the gap between the substrate and the upper electrode 110A, the inner electrode 120A is provided with a plurality of gas injection holes 106A, which are of a size and distribution suitable for supplying a process gas, which is energized into a plasma in a reaction zone beneath the upper electrode 110A.

Single crystal silicon is a preferred material for plasma exposed surfaces of the inner electrode 120A and the outer electrode 130A. High-purity, single crystal silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surfaces of the inner electrode 120A and the outer electrode 130A include polycrystalline silicon, $Y_2O_3$, SiC, $Si_3N_4$, and AlN, for example.

In an embodiment, the showerhead electrode assembly 100A is large enough for processing large substrates, such as semiconductor substrates having a diameter of 300 mm. For 300 mm substrates, the inner electrode 120A is at least 300 mm in diameter. However, the showerhead electrode assembly 100A can be sized to process other substrate sizes.

The backing plate 140A is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing plate 140A include, but are not limited to, graphite, SiC, aluminum (Al), or other suitable materials.

The backing plate 140A is preferably attached to the thermal control plate 102A with suitable mechanical fasteners, which can be threaded bolts, screws, or the like. For example, bolts (not shown) can be inserted in holes in the thermal control plate 102A and screwed into threaded openings in the backing plate 140A. The thermal control plate 102A is preferably made of a machined metallic material, such as aluminum, an aluminum alloy or the like. The upper temperature controlled plate 104A is preferably made of aluminum or an aluminum alloy.

Figure 2A:
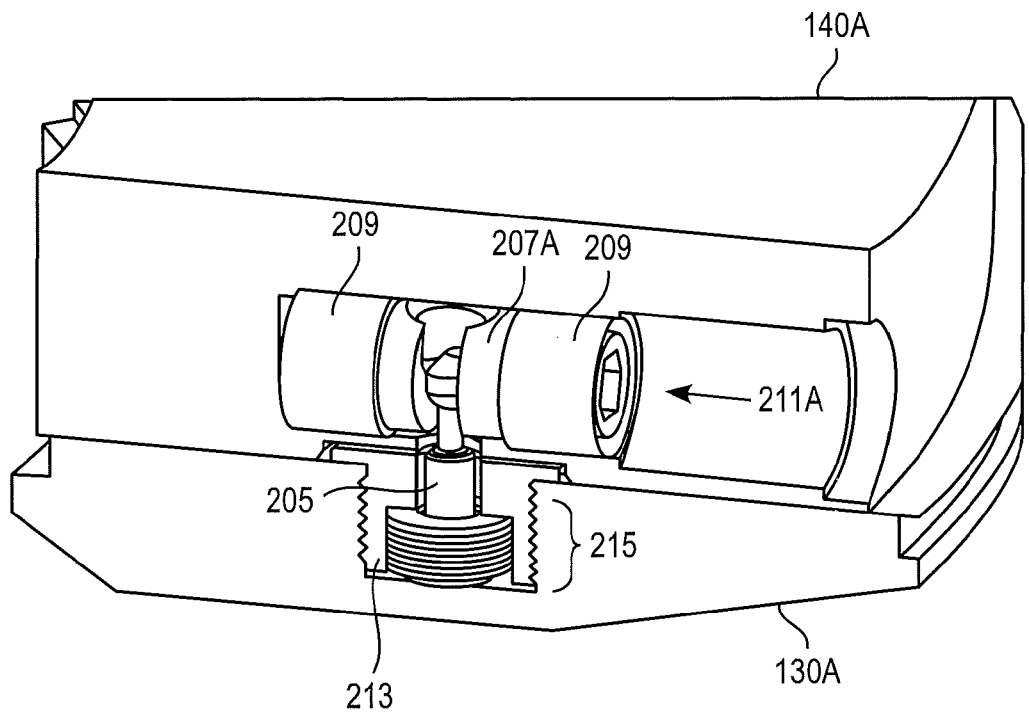
FIG. 2A is a three-dimensional representation of an exemplary cam lock for attaching an outer electrode in the showerhead electrode assembly shown in FIG. 1A.

The outer electrode 130A can be mechanically attached to the backing plate by a cam lock mechanism as described in commonly-assigned WO2009/114175 (published on Sep. 17, 2009) and U.S. Published Application 2010/0003824, the disclosures of which are hereby incorporated by reference. With reference to FIG. 2A, a three-dimensional view of an exemplary cam lock includes portions of the outer electrode 130A and the backing plate 140A. The cam lock is capable of quickly, cleanly, and accurately attaching the outer electrode 130A to the backing plate 140A in a variety of semiconductor fabrication-related tools, such as the plasma etch chamber shown in FIG. 1A.

The cam lock includes a stud (locking pin) 205 mounted into a socket 213. The stud may be surrounded by a disc spring stack 215, such, for example, stainless steel Belleville washers. The stud 205 and disc spring stack 215 may then be press-fit or otherwise fastened into the socket 213 through the use of adhesives or mechanical fasteners. The stud 205 and the disc spring stack 215 are arranged into the socket 213 such that a limited amount of lateral movement is possible between the outer electrode 130A and the backing plate 140A. Limiting the amount of lateral movement allows for a tight fit between the outer electrode 130A and the backing plate 140A, thus ensuring good thermal contact, while still providing some movement to account for differences in thermal expansion between the two parts. Additional details on the limited lateral movement feature are discussed in more detail, below.

In a specific exemplary embodiment, the socket 213 is fabricated from high strength Torlon®. Alternatively, the socket 213 may be fabricated from other materials possessing certain mechanical characteristics such as good strength and impact resistance, creep resistance, dimensional stability, radiation resistance, and chemical resistance may be readily employed. Various materials such as polyamide-imide, acetals, and ultra-high molecular weight polyethylene materials may all be suitable. High temperature-specific plastics and other related materials are not required for forming the socket 213 as 230° C. is a typical maximum temperature encountered in applications such as etch chambers. Generally, a typical operating temperature is closer to 130° C.

Other portions of the cam lock are comprised of a cam shaft 207A optionally surrounded at each end by a pair of cam shaft bearings 209. The cam shaft 207A and cam shaft bearing assembly is mounted into a backing plate bore 211A machined into the backing plate 140A. In a typical application for an etch chamber designed for 300 mm semiconductor substrates, eight or more of the cam locks may be spaced around the periphery of the outer electrode 130A/backing plate 140A combination.

The cam shaft bearings 209 may be machined from a variety of materials including Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding. The stud 205 and cam shaft 207A may be machined from stainless steel (e.g., 316, 316L, 17-7, NITRONIC-60, etc.) or any other material providing good strength and corrosion resistance.

Figure 2B:
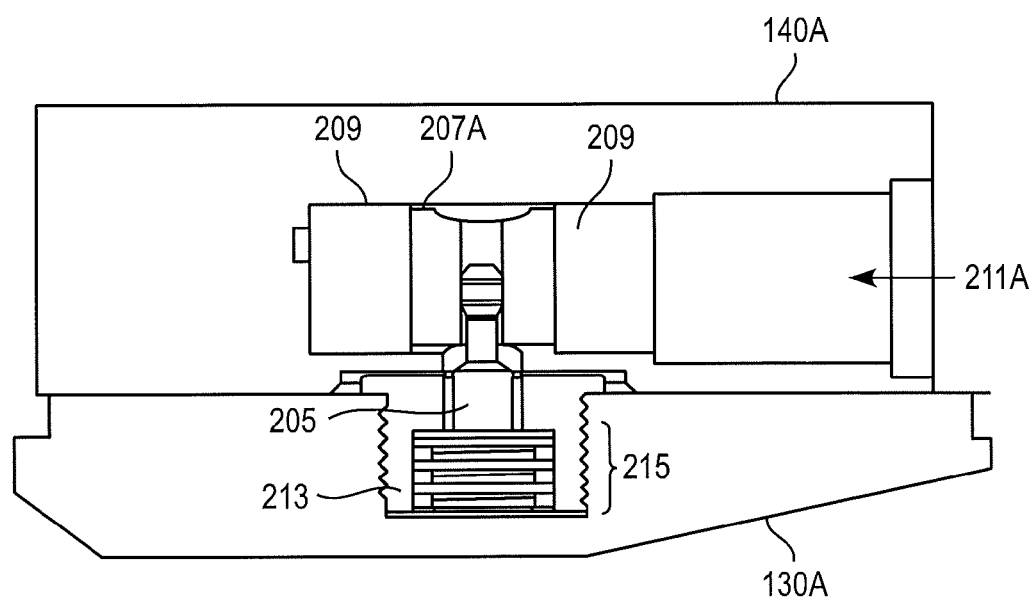
FIG. 2B is a cross-sectional view of the exemplary cam lock of FIG. 2A.

Referring now to FIG. 2B, a cross-sectional view of the cam lock further exemplifies how the cam lock operates by pulling the outer electrode 130A in close proximity to the backing plate 140A. The stud 205/disc spring stack 215/socket 213 assembly is mounted into the outer electrode 130A. As shown, the assembly may be screwed, by means of external threads on the socket 213 into a threaded hole in the outer electrode 130A.

Figure 3:
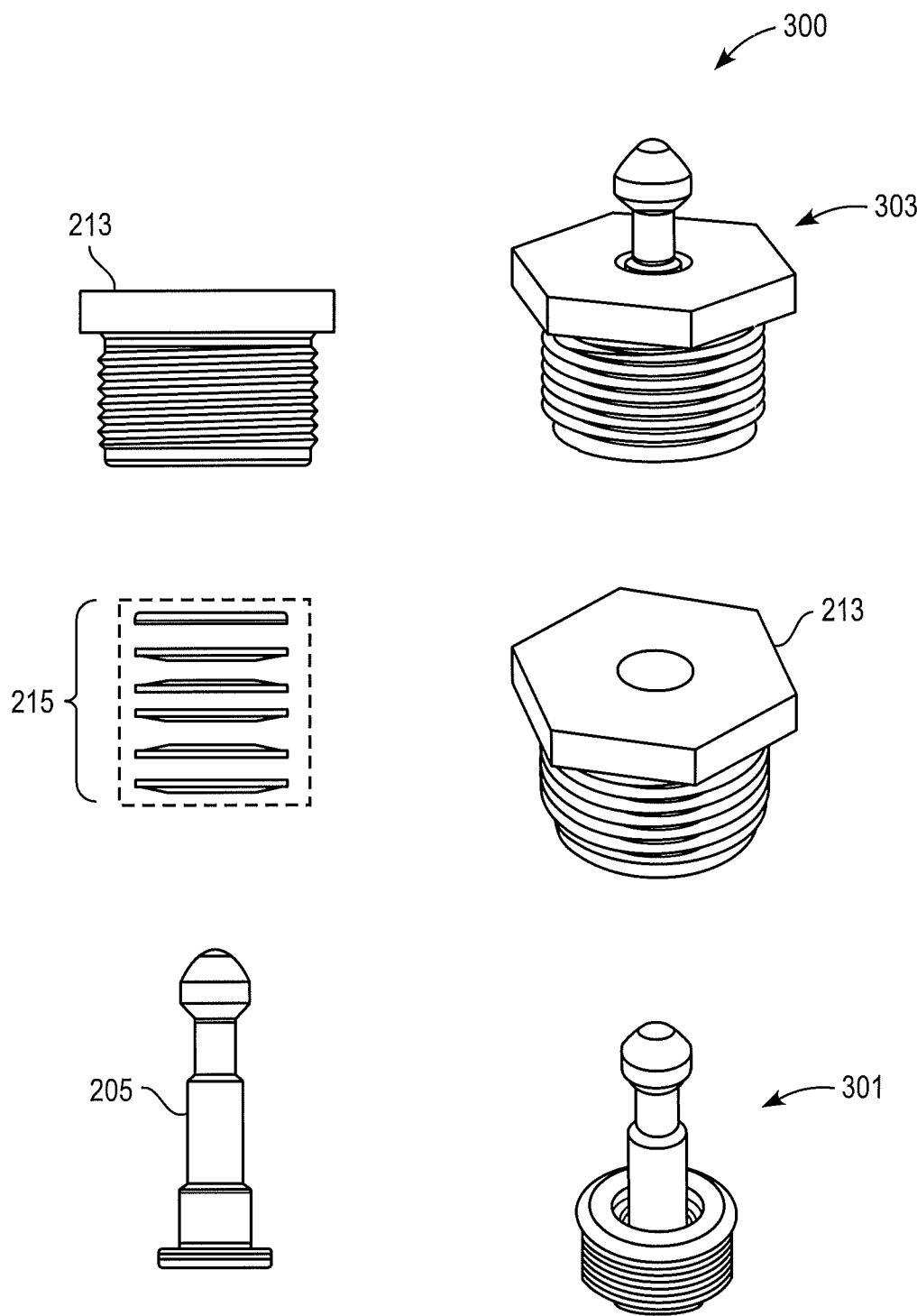
FIG. 3 shows side-elevation and assembly drawings of an exemplary stud used in the cam lock of FIGS. 2A-2D.

In FIG. 3, an elevation and assembly view 300 of the stud 205 having an enlarged head, disc spring stack 215, and socket 213 provides additional detail into an exemplary design of the cam lock. In a specific exemplary embodiment, a stud/disc spring assembly 301 is press fit into the socket 213. The socket 213 has an external thread and a hexagonal top member allowing for easy insertion into the outer electrode 130A (see FIGS. 2A and 2B) with light torque (e.g., in a specific exemplary embodiment, about 20 inch-pounds). As indicated above, the socket 213 may be machined from various types of plastics. Using plastics minimizes particle generation and allows for a gall-free installation of the socket 213 into a mating socket on the outer electrode 130A.

The stud/socket assembly 303 illustrates an inside diameter in an upper portion of the socket 213 being larger than an outside diameter of a mid-section portion of the stud 205. The difference in diameters between the two portions allows for the limited lateral movement in the assembled cam lock as discussed above. The stud/disc spring assembly 301 is maintained in rigid contact with the socket 213 at a base portion of the socket 213 while the difference in diameters allows for some lateral movement. (See also, FIG. 2B.)

Figure 4A:
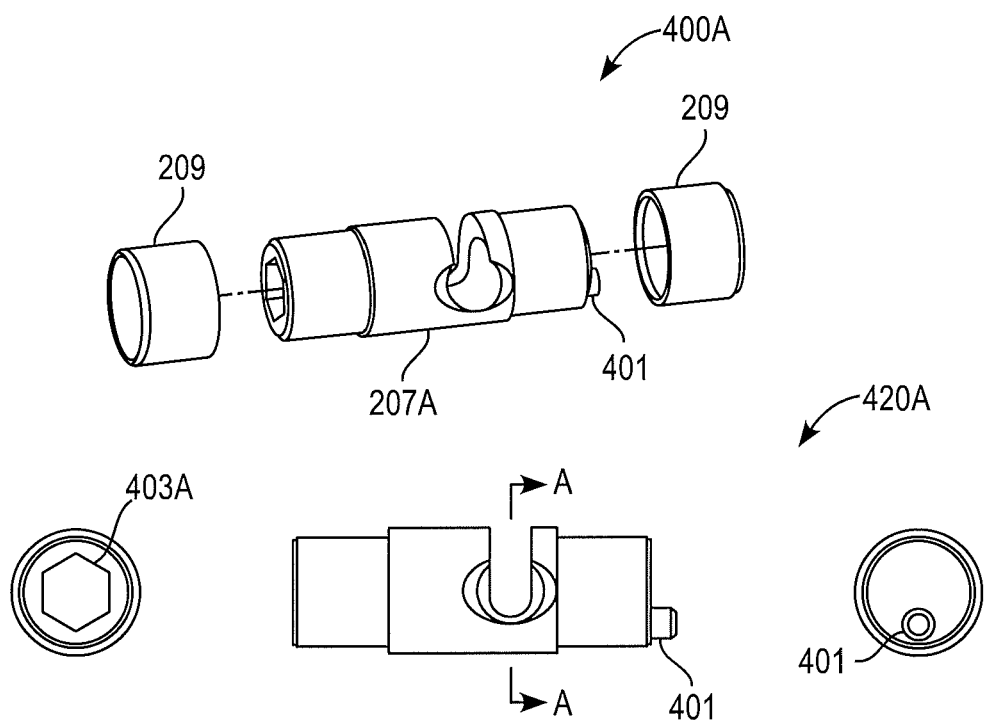
FIG. 4A shows side-elevation and assembly drawings of an exemplary cam shaft used in the cam lock of FIGS. 2A and 2B.

With reference to FIG. 4A, an exploded view 400A of the cam shaft 207A and cam shaft bearings 209 also indicates a keying pin 401. The end of the cam shaft 207A having the keying pin 401 is first inserted into the backing plate bore 211A (see FIG. 2B). A pair of small mating holes (not shown) at a far end of the backing plate bore 211A provide proper alignment of the cam shaft 207A into the backing plate bore 211A. A side-elevation view 420A of the cam shaft 207A clearly indicates a possible placement of a hex opening 403A on one end of the cam shaft 207A and the keying pin 401 on the opposite end.

For example, with continued reference to FIGS. 4A and 2B, the cam lock is assembled by inserting the cam shaft 207A into the backing plate bore 211A. The keying pin 401 limits rotational travel of the cam shaft 207A in the backing plate bore 211A by interfacing with a slot at the bottom of the bore 211A. The cam shaft 207A may first be turned in one direction though use of the hex opening 403A, for example, counter-clockwise, to allow entry of the stud 205 into the cam shaft 207A, and then turned clockwise to fully engage and lock the stud 205. The clamp force required to hold the outer electrode 130A to the backing plate 140A is supplied by compressing the disc spring stack 215 beyond their free stack height. The cam shaft 207A has an internal eccentric cutout which engages the enlarged head of the stud 205. As the disc spring stack 215 compresses, the clamp force is transmitted from individual springs in the disc spring stack 215 to the socket 213 and through the outer electrode 130A to the backing plate 140A.

In an exemplary mode of operation, once the cam shaft bearings 209 are attached to the cam shaft 207A and inserted into the backing plate bore 211A, the cam shaft 207A is rotated counterclockwise to its full rotational travel. The stud/socket assembly 303 (FIG. 3) is then lightly torqued into the outer electrode 130A. The head of the stud 205 is then inserted into the vertically extending through hole below the horizontally extending backing plate bore 211A. The outer electrode 130A is held against the backing plate 140A and the cam shaft 207A is rotated clockwise until either the keying pin reaches the end of the slot at the bottom of the bore 211A or an audible click is heard (discussed in detail, below). The exemplary mode of operation may be reversed to dismount the outer electrode 130A from the backing plate 140A.

Figure 4B:
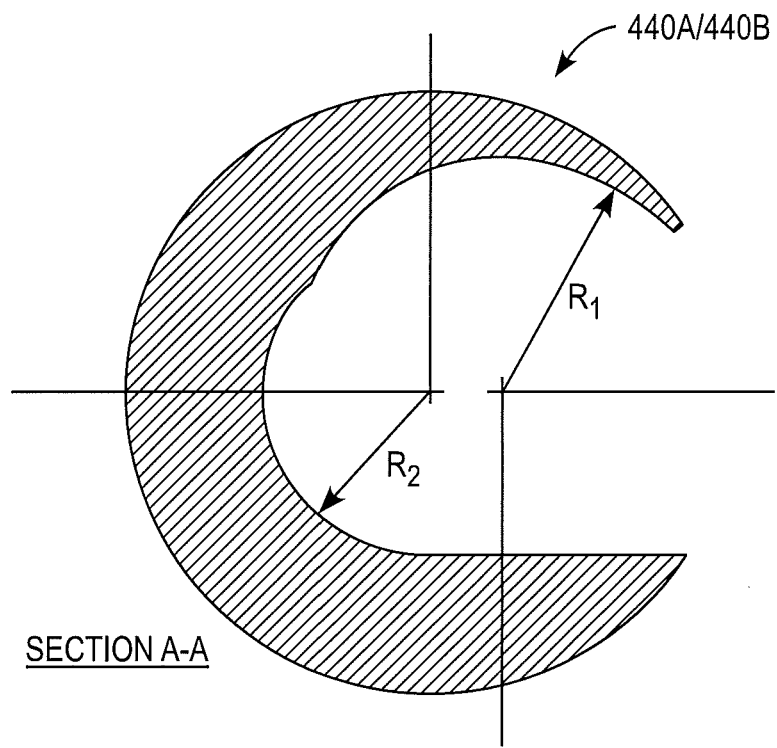
FIG. 4B shows a cross-sectional view of an exemplary cutter-path edge of a portion of the cam shaft of FIG. 4A or FIG. 4C.

With reference to FIG. 4B, a sectional view A-A of the side-elevation view 420A of the cam shaft 207A of FIG. 4A indicates a cutter path edge 440A by which the head of the stud 205 is fully secured. In a specific exemplary embodiment, the two radii R1 and R2 are chosen such that the head of the stud 205 makes the audible clicking noise described above to indicate when the stud 205 is fully secured.

FIGS. 5A-G show details of the inner electrode 120A. The inner electrode 120A is preferably a plate of high purity (less than 10 ppm impurities) low resistivity (0.005 to 0.02 ohm-cm) single crystal silicon.

Figure 5A:
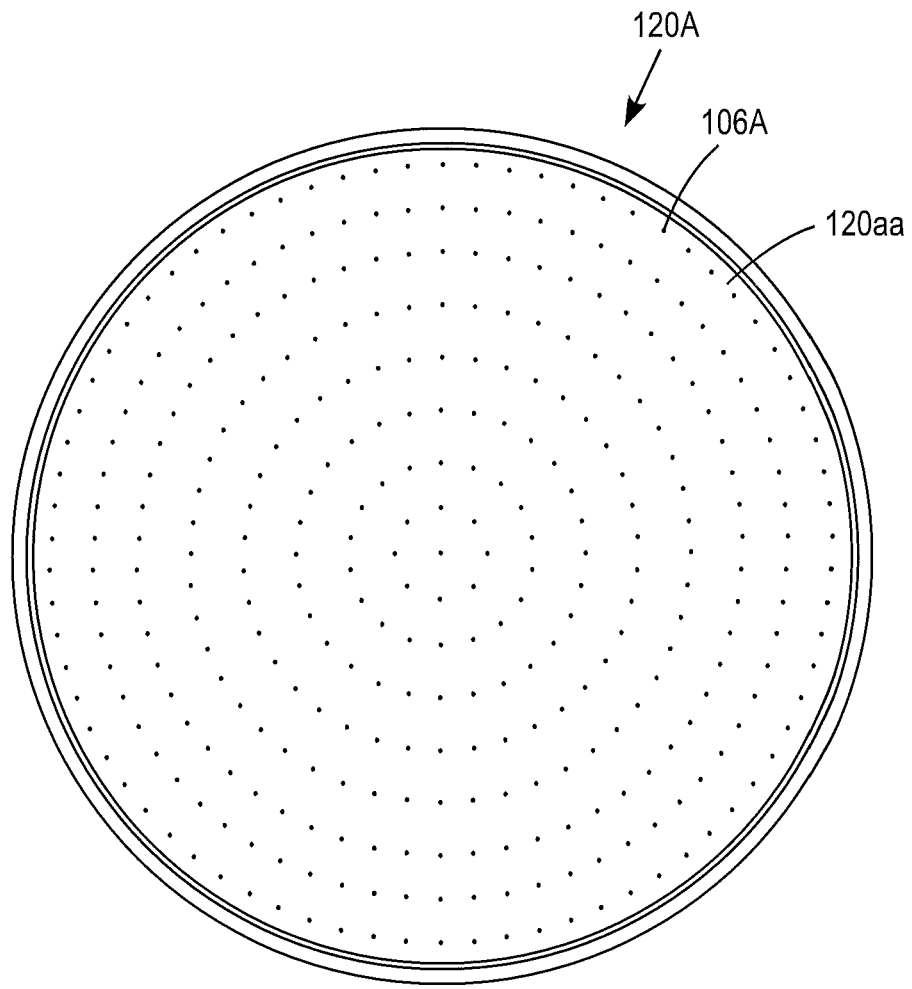
FIG. 5A is a bottom view of an inner electrode in the showerhead electrode assembly in FIG. 1A, showing a plasma exposed surface.

FIG. 5A is a bottom view of the inner electrode 120A, showing the plasma exposed surface 120aa. Gas injection holes 106A of suitable diameter and/or configuration extend from the mounting surface 120ab to the plasma exposed surface 120aa (FIG. 5B) and can be arranged in any suitable pattern. Preferably, the diameter of the gas injection holes 106A is less than or equal to 0.04 inch; more preferably, the diameter of the gas injection holes 106A is between 0.01 and 0.03 inch; further preferably, the diameter of the gas injection holes 106A is 0.02 inch. In the embodiment shown, one gas injection hole is located at the center of the inner electrode 120A; the other gas injection holes are arranged in eight concentric rows with 8 gas injection holes in the first row located about 0.6-0.7 (e.g. 0.68) inch from the center of the electrode, 18 gas injection holes in the second row located about 1.3-1.4 (e.g. 1.34) inch from the center, 28 gas injection holes in the third row located about 2.1-2.2 (e.g. 2.12) inches from the center, 38 gas injection holes in the fourth row located about 2.8-3.0 (e.g. 2.90) inches from the center, 48 gas injection holes in the fifth row located about 3.6-3.7 (e.g. 3.67) inches from the center, 58 gas injection holes in the sixth row located about 4.4-4.5 (e.g. 4.45) inches from the center, 66 gas injection holes in the seventh row located about 5.0-5.1 (e.g. 5.09) inches from the center, and 74 gas injection holes in the eighth row located about 5.7-5.8 (e.g. 5.73) inches from the center. The gas injection holes in each of these rows are azimuthally evenly spaced.

Figure 5B:
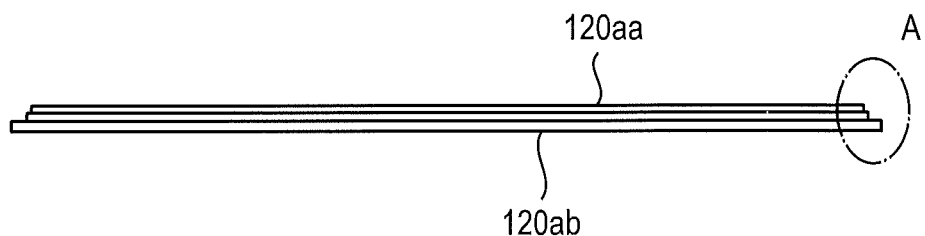
FIG. 5B is a cross-sectional view of the inner electrode in FIG. 5A.
Figure 5C:
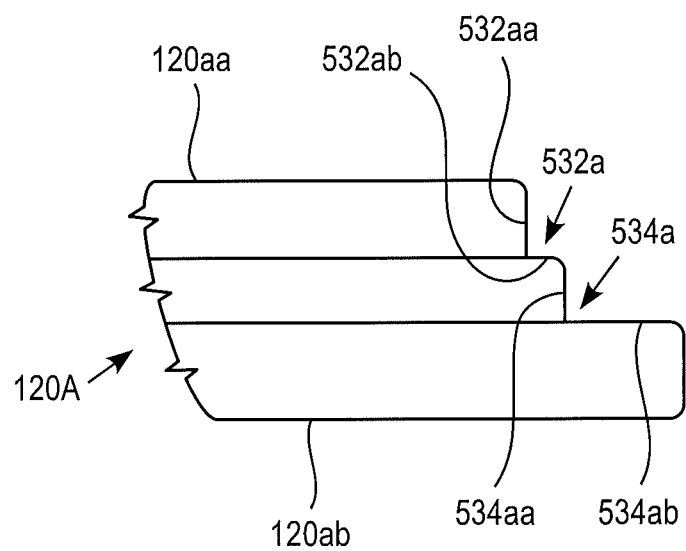
FIG. 5C is an enlarged view of the area A in FIG. 5B.

FIG. 5B is a cross-sectional view of the inner electrode 120A along a diameter thereof. The outer circumferential surface includes two steps. FIG. 5C is an enlarged view of the area A in FIG. 5B. An inner step 532a and an outer step 534a extend completely around the inner electrode 120A. In a preferred embodiment, the silicon plate has a thickness of about 0.40 inch and an outer diameter of about 12.5 inches; the inner step 532a has an inner diameter of about 12.0 inches and an outer diameter of about 12.1 inches and; the outer step 534a has an inner diameter of about 12.1 inches and an outer diameter of about 12.5 inches. The inner step 532a has a vertical surface 532aa about 0.13 inch long and a horizontal surface 532ab about 0.07 inch long and the outer step 534a has a vertical surface 534aa about 0.11 inch long and a horizontal surface 534ab about 0.21 inch long.

Figure 5D:
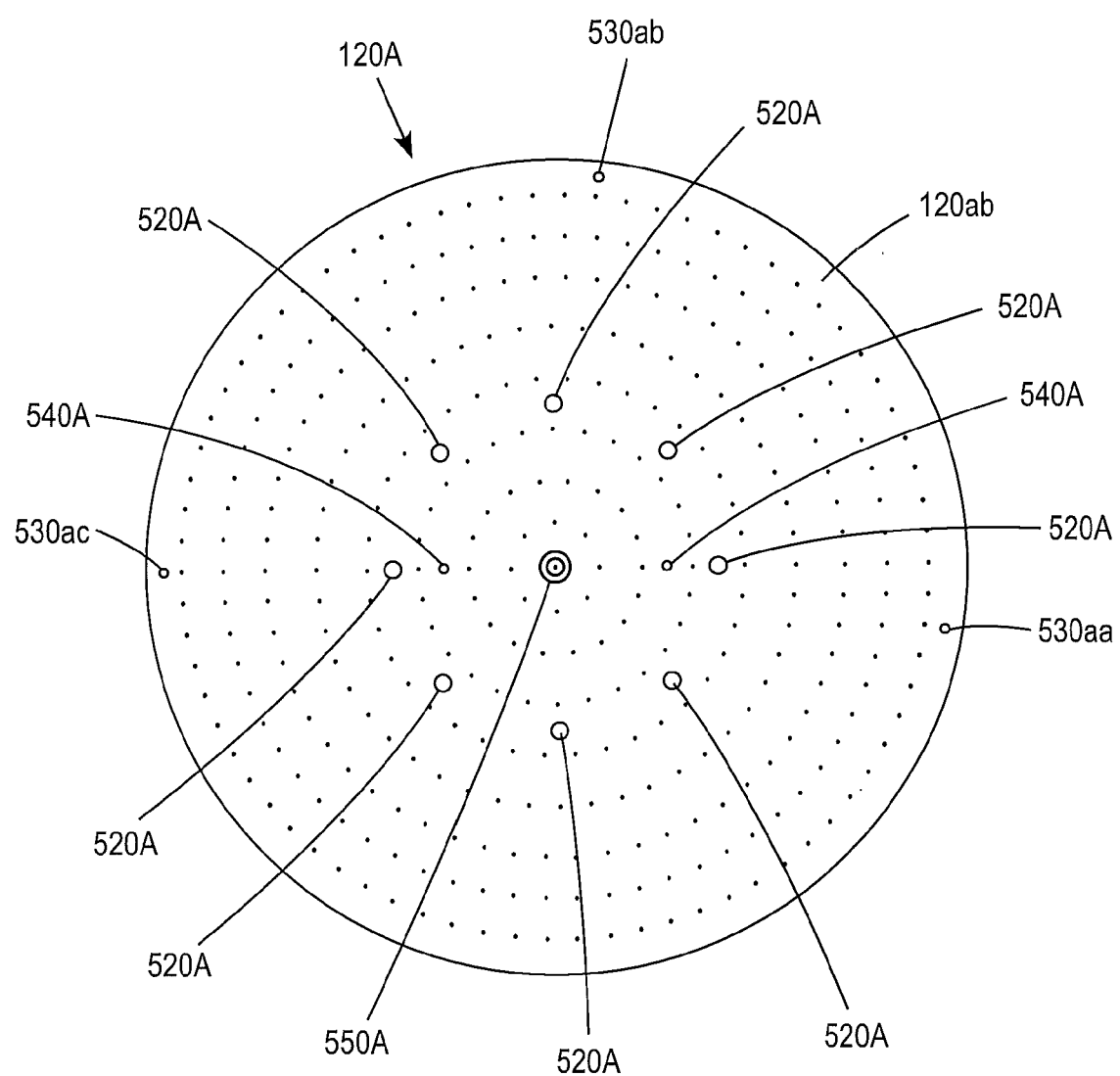
FIG. 5D is a top view of the inner electrode in FIG. 5A, showing a mounting surface.
Figure 5E:
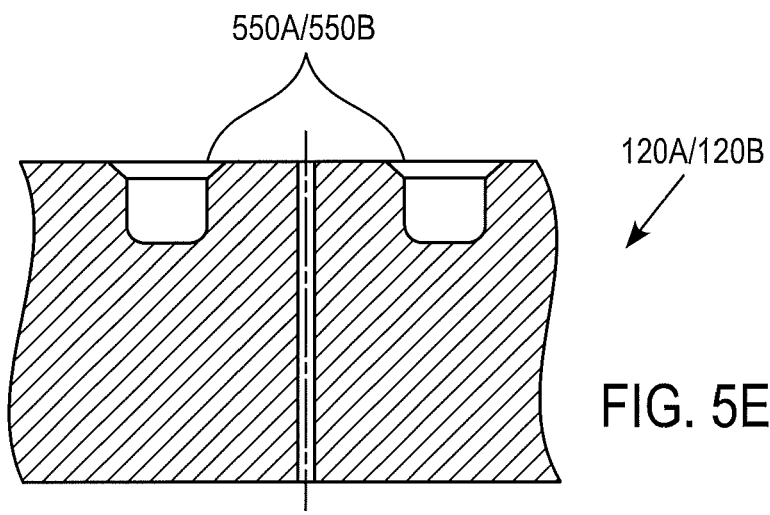
FIG. 5E is a partial cross-sectional view of the inner electrode in FIG. 5D or FIG. 5K across an annular groove 550A or 550B.
Figure 5F:
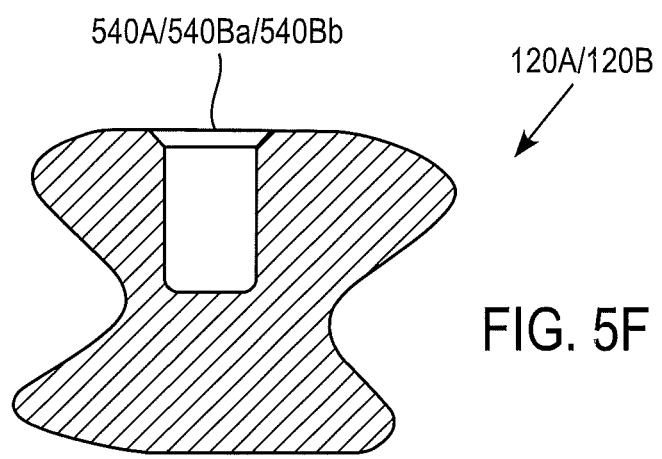
FIG. 5F is a partial cross-sectional view of the inner electrode in FIG. 5D or FIG. 5K across a hole 540A in FIG. 5D or a hole 540Ba or 540Bb in FIG. 5K.
Figure 5G:
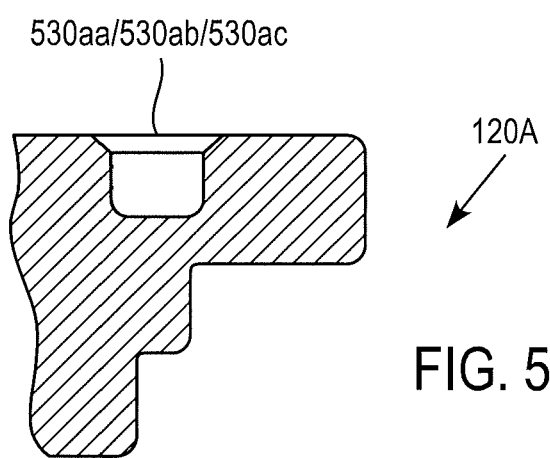
FIG. 5G is a partial cross-sectional view of the inner electrode in FIG. 5D across a hole 530*aa*, 530*ab* or 530*ac* in FIG. 5D.

FIG. 5D is a top view of the inner electrode 120A, showing the mounting surface 120ab. The mounting surface 120ab includes an annular groove 550A (details shown in FIG. 5E) concentric with the inner electrode 120A, the annular groove 550A having an inner diameter of about 0.24 inch, an outer diameter of about 0.44 inch, a depth of at least 0.1 inch, a 45° chamfer of about 0.02 inch wide on the entrance edge, and a fillet of a radius between 0.015 and 0.03 inch on the bottom corners.

The mounting surface 120ab also includes two smooth (unthreaded) blind holes 540A configured to receive alignment pins (details shown in FIG. 5F) located at a radius between 1.72 and 1.73 inches from the center of the inner electrode 120A and offset by about 180° from each other, the blind holes 540A having a diameter of about 0.11 inch, a depth of at least 0.2 inch, a 45° chamfer of about 0.02 inch on an entrance edge, and a fillet with a radius of at most 0.02 inch on a bottom corner.

The mounting surface 120ab also includes threaded blind holes arranged in an annular mounting hole zone which divides the mounting surface into a central portion and an outer portion. The mounting hole zone is preferably located on a radius of ¼ to ½ the radius of the inner electrode 120A. In a preferred embodiment, a row of eight ¼-32 (Unified Thread Standard) threaded blind holes 520A, are located on a radius between 2.4 and 2.6 inches (e.g., 2.5 inches) from the center of the inner electrode 120A and azimuthally offset by about 45° between each pair of adjacent holes 520A. Each of the holes 520A has a total depth of about 0.3 inch, a threaded depth of at least 0.25 inch from the entrance edge, and a 45° chamfer of about 0.05 inch wide on the entrance edge. One of the holes 520A is azimuthally aligned with another one of the holes 540A. As used herein, two objects being "azimuthally aligned" means a straight line connecting these two objects passes through the center of a circle or ring, in this embodiment, the center of the inner electrode 120A.

The mounting surface 120ab further includes first, second and third smooth (unthreaded) blind holes configured to receive alignment pins (530aa,530ab and 530ac, respectively, or 530a collectively) (details shown in FIG. 5G) radially aligned at a radius between 6.0 and 6.1, preferably between 6.02 and 6.03 inches from the center of the inner electrode 120A. "Radially aligned" means the distances to the center are equal. The holes 530a have a diameter between 0.11 and 0.12 inch, a depth of at least 0.1 inch, a 45° chamfer of about 0.02 inch wide on an entrance edge, and a fillet with a radius of at most 0.02 inch on a bottom corner. The first hole 530aa is offset by about 10° clockwise azimuthally from one of the unthreaded blind holes 540A; the second hole 530ab is offset by about 92.5° counterclockwise azimuthally from the first hole 530aa; the third hole 530ac is offset by about 190° counterclockwise azimuthally from the first hole 530aa.

Referring to FIG. 1A, the inner electrode 120A is clamped to the backing plate 140A by a clamp ring 150A engaging the outer step 534a on the lower face and a plurality of bolts 160A engaging the threaded blind holes 520A in the mounting surface 120ab. The clamp ring 150A includes a series of holes which receive fasteners such as bolts (screws) threaded into threaded openings in an underside of the backing plate 140A. To avoid contact of the clamp ring 150A with the step 534a on the inner electrode 120A, a compression ring 170A of a stiff material such as a hard polyimide material such as CIRLEX® is compressed between opposed surfaces of the inner electrode 120A and the clamp ring 150A (FIG. 1C).

Figure 6:
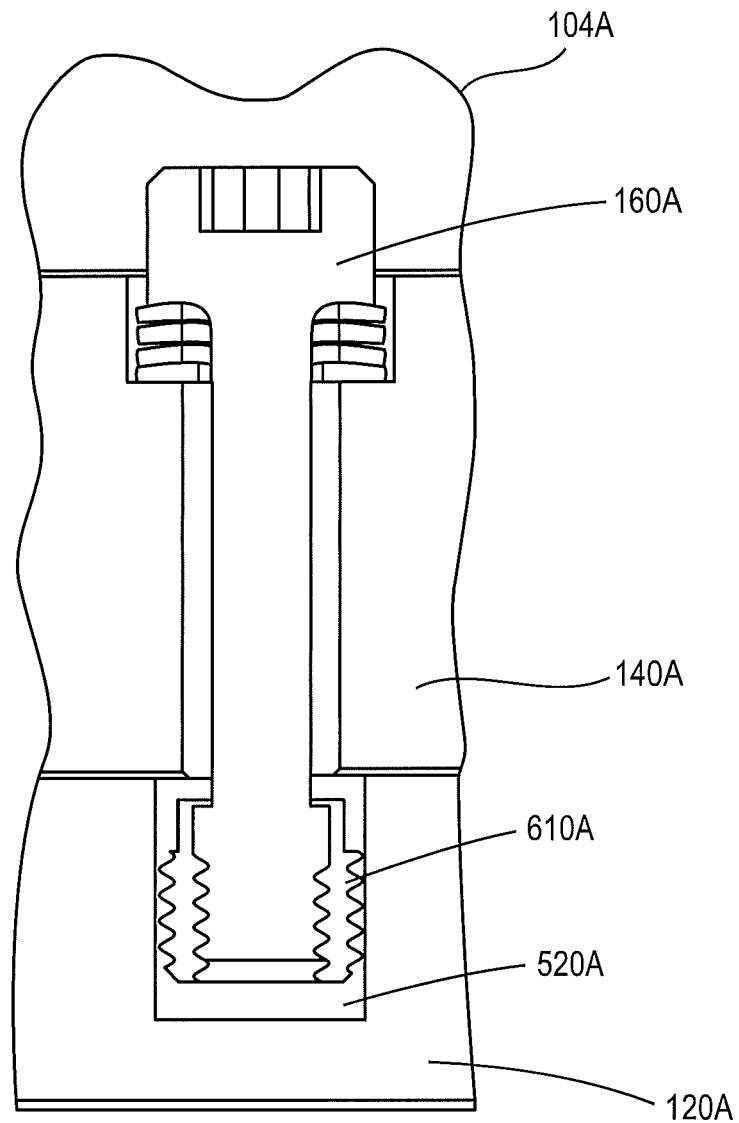
FIG. 6 is an enlarged view of the proximity of a bolt 160A in FIG. 1A.

FIG. 6 shows an enlarged portion in FIG. 1A near one of the bolts 160A. The bolts 160A are of 8-32 size. During installation of the inner electrode 120A, a plastic insert 610A preferably made of TORLON® 5030 is threaded into each threaded blind hole 520A. The plastic insert 610A has an inner thread of 8-32 and an outer thread of ¼-32. An 8-32 bolt 160A is threaded into each plastic insert 610A. During operation of the showerhead electrode assembly 100A, the inner electrode 120A is heated by a plasma and/or heating arrangement and this heating can cause warping in the inner electrode 120A and adversely affect the uniformity of the plasma processing rate across the plasma chamber. The bolts 160A in combination with the clamp ring 150A provide points of mechanical support, reduce warping of the inner electrode 120A, and hence reduce processing rate non-uniformity and thermal non-uniformity.

Figure 7A:
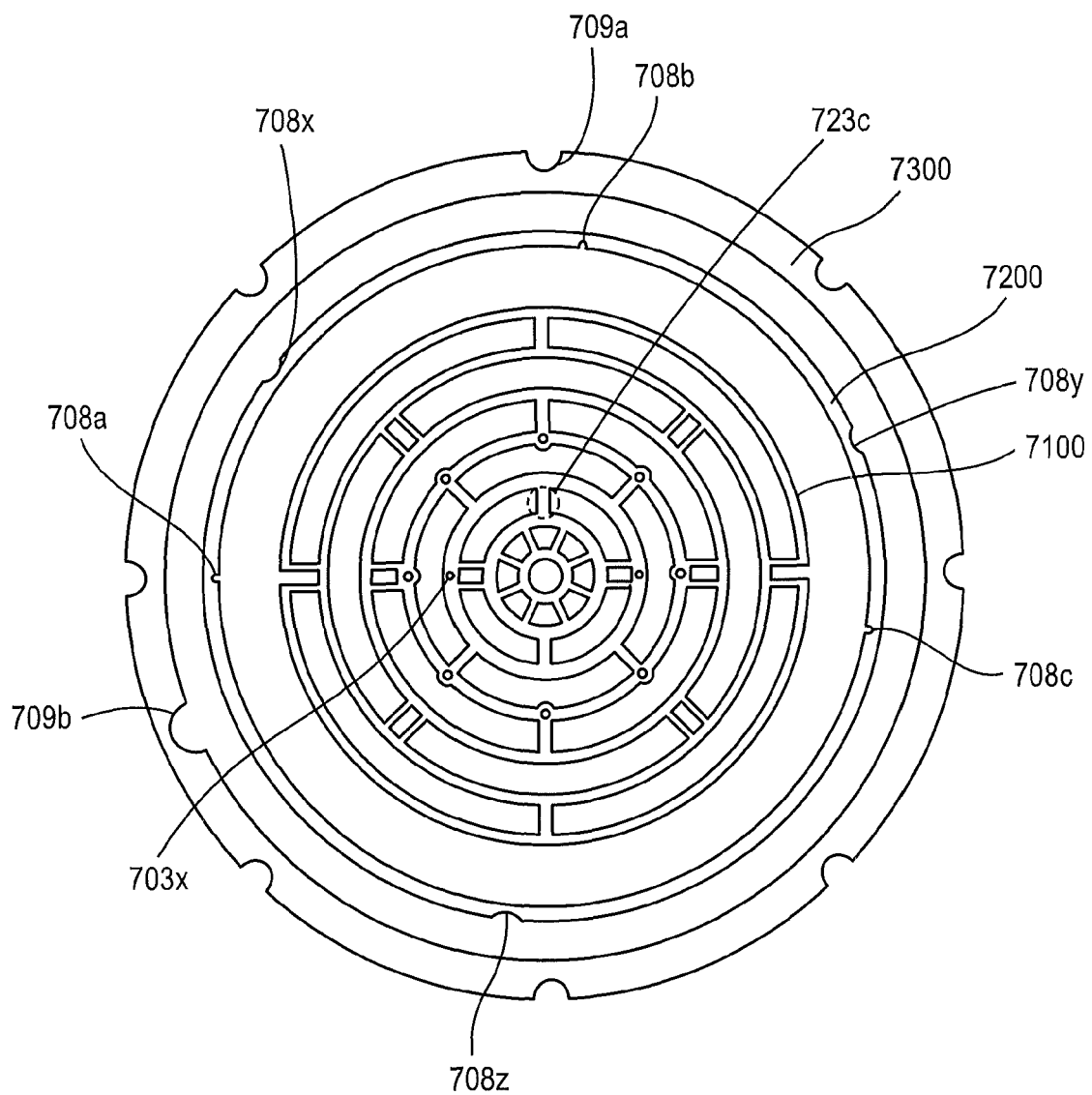
FIG. 7A is a top view of an inner gasket, a middle gasket and an outer gasket.

FIG. 7A shows a top view of a thermally and electrically conductive gasket set. This gasket set comprises an inner gasket 7100 comprising a plurality of concentric rings connected by a plurality of spokes, an annular middle gasket 7200 with a plurality of cutouts on an outer and an inner perimeter, and an annular outer gasket 7300 with a plurality of cutouts on an outer perimeter and one cutout on an inner perimeter. The gaskets are preferably electrically and thermally conductive and made of a material compatible for semiconductor processing in a vacuum environment, e.g., about 10 to 200 mTorr, having low particle generation, being compliant to accommodate shear at contact points, and free of metallic components that are lifetime killers in semiconductor substrates such as Ag, Ni, Cu and the like. The gaskets can be a silicone-aluminum foil sandwich gasket structure or an elastomer-stainless steel sandwich gasket structure. The gaskets can be an aluminum sheet coated on upper and lower sides with a thermally and electrically conductive rubber compatible in a vacuum environment used in semiconductor manufacturing wherein steps such as plasma etching are carried out. The gaskets are preferably compliant such that it can be compressed when the electrode and backing plate are mechanically clamped together but prevent opposed surfaces of the electrode and backing plate from rubbing against each other during temperature cycling of the showerhead electrode. The gaskets can be manufactured of a suitable material such as "Q-PAD II" available from the Bergquist Company. The thickness of the gaskets is preferably about 0.006 inch. The various features of the gaskets can be knife-cut, stamped, punched, or preferably laser-cut from a continuous sheet. The gasket set is mounted between the backing plate 140A and the inner electrode 120A and outer electrode 130A to provide electrical and thermal contact therebetween.

Figure 7B:
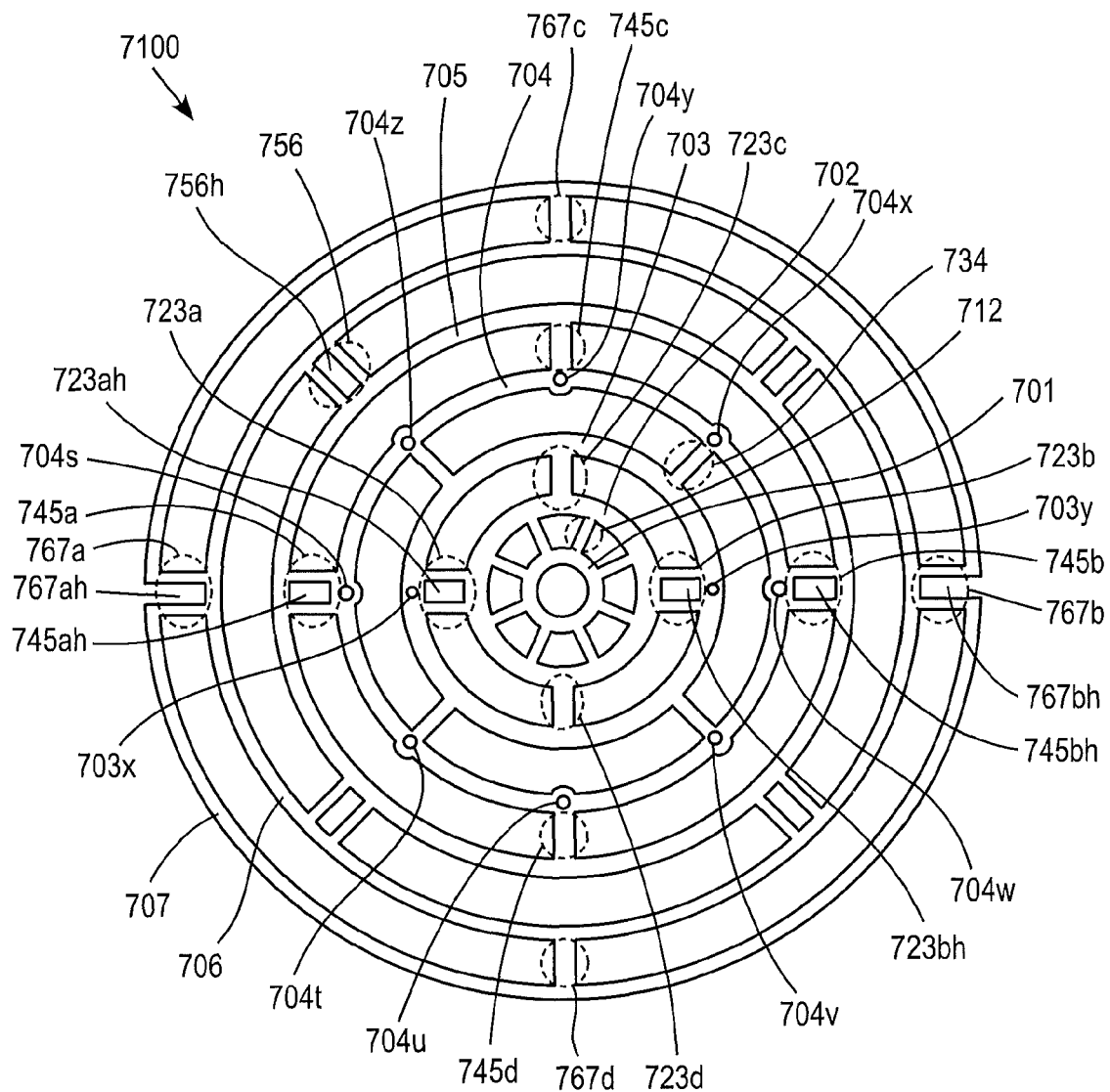
FIG. 7B is an enlarged view of the inner gasket 7100 in FIG. 7A.

FIG. 7B shows the details of the inner gasket 7100. The inner gasket 7100 preferably comprises seven concentric rings interconnected by radial spokes. A first ring 701 has an inner diameter of at least 0.44 inch (e.g. between 0.62 and 0.65 inch) and an outer diameter of at most 1.35 inches (e.g. between 0.97 and 1.00 inch). The first ring 701 is connected to a second ring 702 by eight radially extending and azimuthally evenly spaced spokes 712. Each spoke 712 has a width of about 0.125 inch.

The second ring 702 has an inner diameter of at least 1.35 inches (e.g. between 1.74 and 1.76 inches) and an outer diameter of at most 2.68 inches (e.g. between 2.26 and 2.29 inches). The second ring is connected to a third ring 703 by four radially extending and azimuthally evenly spaced spokes. Two of these four spokes 723a and 723b oppose each other about the center of the inner gasket 7100 and each has a width of about 0.5 inch and a rounded rectangular opening (723ah or 723bh) of about 0.25 inch by about 0.46 inch. The other two of these four spokes 723c and 723d oppose each other about the center of the inner gasket 7100 and each has a width of about 0.25 inch. One spoke 723c is offset azimuthally from one of the spokes 712 by about 22.5°.

The third ring 703 has an inner diameter of at least 2.68 inches (e.g. between 3.17 and 3.20 inches) and an outer diameter of at most 4.23 inches (e.g. between 3.71 and 3.74 inches). The third ring is connected to a fourth ring 704 by four radially extending and azimuthally evenly spaced spokes 734. Each spoke has a width of about 0.18 inch. One of the spokes 734 is offset azimuthally by about 45° from the spoke 723c. The third ring 703 also includes two round holes 703x and 703y azimuthally offset by about 180° from each other and located at a radial distance between 1.72 and 1.74 inches from the center of the inner gasket 7100. The round holes 703x and 703y have a diameter of about 0.125 inch. One round hole 703x is offset azimuthally by about 90° from the spoke 723c. The round holes 703x and 703y are configured to receive alignment pins.

The fourth ring 704 has an inner diameter of at least 4.23 inches (e.g. between 4.78 and 4.81 inches) and an outer diameter of at most 5.79 inches (e.g. between 5.19 and 5.22 inches). The fourth ring 704 is connected to a fifth ring 705 by four radially extending and azimuthally evenly spaced spokes. Two of these four spokes 745a and 745b oppose each other about the center of the inner gasket 7100 and each has a width of about 0.5 inch and a rounded rectangular opening (745ah or 745bh) of about 0.25 inch by about 0.51 inch. The other two of these four spokes 745c and 745d oppose each other about the center of the inner gasket 7100 and each has a width of about 0.25 inch. One spoke 745a is offset azimuthally by about 90° counterclockwise from the spokes 723c. The fourth ring 704 also includes eight round holes 704s, 704t, 704u, 704v, 704w, 704x, 704y and 704z (configured to receive bolts) azimuthally offset by about 45° between each adjacent pair and located at a radial distance between 2.49 and 2.51 inches from the center of the inner gasket 7100. These round holes 704s, 704t, 704u, 704v, 704w, 704x, 704y and 704z have a diameter of about 0.18 inch. One round hole 704s is offset azimuthally by about 90° counterclockwise from the spoke 723c. Around each of the round holes 704s, 704u, 704w and 704y, the fourth ring 704 has a round protrusion on the inner periphery thereof. Around each of the round holes 704t, 704v, 704x and 704z, the fourth ring 704 has a round protrusion on the outer periphery thereof. Each protrusion has an outer diameter of about 0.36 inch.

The fifth ring 705 has an inner diameter of at least 5.79 inches (e.g. between 6.35 and 6.37 inches) and an outer diameter of at most 7.34 inches (e.g. between 6.73 and 6.75 inches). The fifth ring 705 is connected to a sixth ring 706 by four radially extending and azimuthally evenly spaced spokes 756. One of the spokes 756 is offset azimuthally by about 45° from the spoke 723c. Each the spokes 756 has a width of about 0.5 inch and a rectangular opening 756h of about 0.25 inch by about 0.60 inch.

The sixth ring 706 has an inner diameter of at least 7.34 inches (e.g. between 7.92 and 7.95 inches) and an outer diameter of at most 8.89 inches (e.g. between 8.16 and 8.36 inches). The sixth ring 706 is connected to a seventh ring 707 by four radially extending and azimuthally evenly spaced spokes. Two of these four spokes 767a and 767b oppose each other about the center of the inner gasket 7100 and each has a width of about 0.5 inch and a rectangular opening (767ah or 767bh) of about 0.25 inch wide. The openings 767ah and 767bh extend outward radially and separate the seventh ring 707 into two half circles. The other two of these four spokes 767c and 767d oppose each other about the center of the inner gasket 7100 and each has a width of about 0.25 inch. Spoke 767d is offset azimuthally by about 180° from the spoke 723c.

The seventh ring 707 has an inner diameter of at least 8.89 inches (e.g. between 9.34 and 9.37 inches) and an outer diameter of at most 10.18 inches (e.g. between 9.66 and 9.69 inches). Each corner at joints between the rings and spokes in the inner gasket 7100 is rounded to a radius of about 0.06 inch.

The middle gasket 7200 (see FIG. 7A) has an inner diameter of about 11.95 inches and an outer diameter of about 12.47 inches. The middle gasket 7200 has three small-diameter cutouts 708a, 708b and 708c on its inner perimeter. The cutouts 708b and 708c are azimuthally offset from the cutout 708a by about 92.5° clockwise and about 190° clockwise, respectively. The centers of the cutouts 708a, 708b and 708c are located at a radial distance of about 6.02 inches from the center of the middle gasket 7200. The cutouts 708a, 708b and 708c face inward and include a semi-circular outer periphery with a diameter of about 0.125 inch and include an inner opening with straight radial edges. The middle gasket 7200 also has three large-diameter round and outwardly facing cutouts 708x, 708y and 708z on its outer perimeter. The cutouts 708x, 708y and 708z are azimuthally equally spaced and have a diameter of about 0.72 inch. Their centers are located at a radial distance of about 6.48 inches from the center of the middle gasket 7200. The cutout 708x is azimuthally offset from the cutout 708a by about 37.5° clockwise. When installed in the showerhead electrode assembly (as described in details hereinbelow), the cutout 708a is azimuthally aligned with the hole 703x on the third ring 703 in the inner gasket 7100.

The outer gasket 7300 has an inner diameter of about 13.90 inches and an outer diameter of about 15.31 inches. The outer gasket 7300 has eight semicircular outwardly facing cutouts 709a equally spaced azimuthally on its outer perimeter. The centers of the cutouts 709a are located at a radial distance of about 7.61 inches from the center of the outer gasket 7300. The cutouts 709a have a diameter of about 0.62 inch. When installed in the showerhead electrode assembly (as described in details hereinbelow), one of the cutouts 709a is azimuthally aligned with the hole 703x on the third ring 703 in the inner gasket 7100. The outer gasket 7300 also has one round inwardly facing cutout 709b on the inner perimeter thereof. The center of this cutout 709b is located at a distance of about 6.98 inches from the center of the outer gasket 7300. The cutout 709b has a diameter of about 0.92 inch. When installed in the showerhead electrode assembly (as described in details hereinbelow), the cutout 709b is azimuthally offset from the hole 703x by about 22.5° counterclockwise.

When the inner electrode 120A is installed in the showerhead electrode assembly 100A, an alignment ring 108A (FIG. 1A), two inner alignment pins 109A (FIG. 1A) and three outer alignment pins (not shown in FIG. 1A) are first inserted into the annular groove 550A, holes 540A and holes 530a (FIG. 5D), respectively. The inner gasket 7100 is then mounted to the inner electrode 120A. The holes 703x and 703y (FIG. 7B) correspond to the inner alignment pins 109A; and the center hole of the inner gasket 7100 corresponds to the alignment ring 108A and the center gas injection hole in the inner electrode 120A. Rectangular and quarter-circular openings between the seven rings and in the spokes in the inner gasket 7100 correspond to the first row through the sixth row of gas injection holes in the inner electrode 120A. The middle gasket 7200 is mounted onto the inner electrode 120A. The cutouts 708a, 708b and 708c correspond to the holes 530ac, 530ab and 530aa, respectively. The seventh and eighth rows of gas injection holes fall in the opening between the inner gasket 7100 and the middle gasket 7200. Eight bolts 160A with their corresponding inserts 610A are threaded into the eight threaded blind holes 520A to fasten the inner electrode 120A to the backing plate 140A, with the inner gasket 7100 and middle gasket 7200 sandwiched therebetween. The clamp ring 150A is fastened onto the backing plate 140A by a plurality of bolts threaded into threaded openings in the underside of the backing plate 140A. The bolts 160A and the clamp ring 150A support the inner electrode 120A at a location between the center and outer edge and at the outer edge, respectively, in order to reduce warping of the inner electrode 120A caused by temperature cycling during processing of substrates. The outer gasket 7300 is placed on the outer electrode 130A. The eight cutouts 709a correspond to the eight cam lock mechanisms. The outer electrode 130A is fastened against the backing plate 140A by rotating the cam shaft 207A of each cam lock.

Figure 1B:
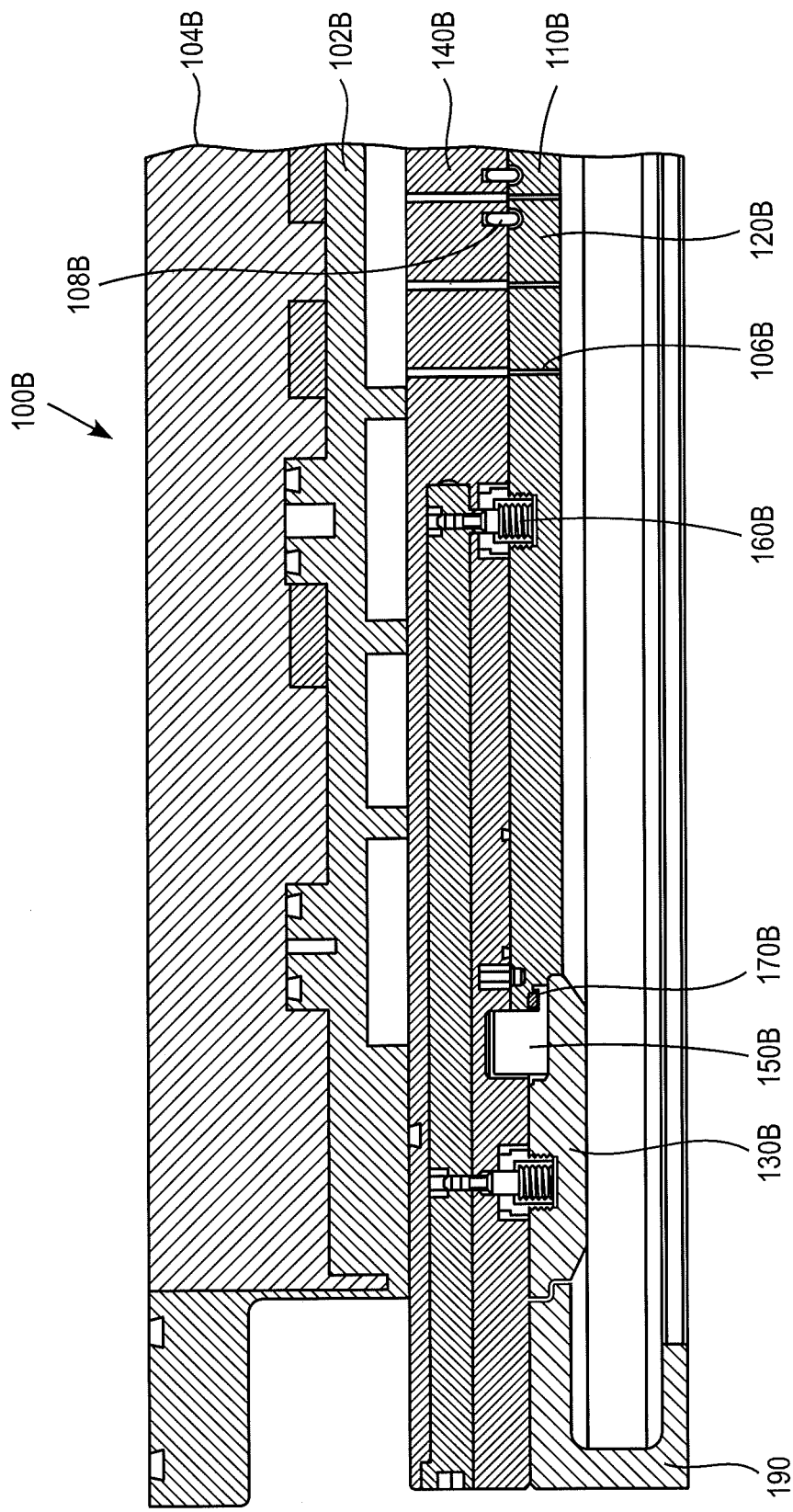
FIG. 1B shows a partial cross-sectional view of a showerhead electrode assembly for a capacitively coupled plasma reaction chamber, according to another embodiment.
Figure 1C:
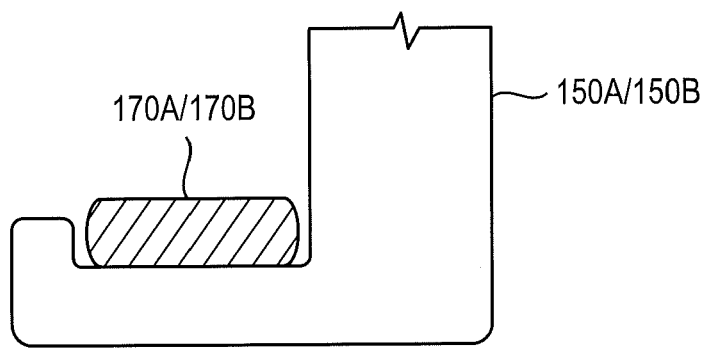
FIG. 1C shows the details of a compression ring mounted on a clamp ring.

FIG. 1B shows a cross-sectional view of a portion of another showerhead electrode assembly 100B of a plasma reaction chamber for etching semiconductor substrates. As shown in FIG. 1B, the showerhead electrode assembly 100B includes an upper electrode 110B, and a backing plate 140B. The assembly 100B also includes a thermal control plate 102B, and a top plate 104B having liquid flow channels therein. The upper electrode 110B preferably includes an inner electrode 120B, and an outer electrode 130B. The inner electrode 120B may be made of a conductive high purity material such as single crystal silicon, polycrystalline silicon, silicon carbide or other suitable material. The inner electrode 120B is a consumable part which must be replaced periodically. An annular shroud 190 with a C-shaped cross section surrounds the outer electrode 130B. The backing plate 140B is mechanically secured to the inner electrode 120B, the outer electrode 130B and the shroud 190 with mechanical fasteners described below.

During use, process gas from a gas source is supplied to the inner electrode 120B through one or more passages in the upper plate 104B which permit process gas to be supplied to a single zone or multiple zones above the substrate.

The inner electrode 120B is preferably a planar disk or plate. The inner electrode 120B can have a diameter smaller than, equal to, or larger than a substrate to be processed, e.g., up to 300 mm, if the plate is made of single crystal silicon, which is the diameter of currently available single crystal silicon material used for 300 mm substrates. For processing 300 mm substrates, the outer electrode 130B is adapted to expand the diameter of the inner electrode 120B from about 12 inches to about 17 inches. The outer electrode 130B can be a continuous member (e.g., a single crystal silicon, polycrystalline silicon, silicon carbide or other suitable material in the form of a ring) or a segmented member (e.g., 2-6 separate segments arranged in a ring configuration, such as segments of single crystal silicon, polycrystalline silicon, silicon carbide or other material). To supply process gas to the gap between the substrate and the upper electrode 110B, the inner electrode 120B is provided with a plurality of gas injection holes 106B, which are of a size and distribution suitable for supplying a process gas, which is energized into a plasma in a reaction zone beneath the upper electrode 110B.

Single crystal silicon is a preferred material for plasma exposed surfaces of the inner electrode 120B and the outer electrode 130B. High-purity, single crystal silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surfaces of the inner electrode 120B, the outer electrode 130B and the annular shroud 190 include polycrystalline silicon, $Y_2O_3$, SiC, $Si_3N_4$, and AlN, for example.

In an embodiment, the showerhead electrode assembly 100B is large enough for processing large substrates, such as semiconductor substrates having a diameter of 300 mm. For 300 mm substrates, the inner electrode 120B is at least 300 mm in diameter. However, the showerhead electrode assembly 100B can be sized to process other substrate sizes.

The backing plate 140B is preferably made of a material that is chemically compatible with process gases used for processing semiconductor substrates in the plasma processing chamber, has a coefficient of thermal expansion closely matching that of the electrode material, and/or is electrically and thermally conductive. Preferred materials that can be used to make the backing plate 140B include, but are not limited to, graphite, SiC, aluminum (Al), or other suitable materials.

The backing plate 140B is preferably attached to the thermal control plate 102B with suitable mechanical fasteners, which can be threaded bolts, screws, or the like. For example, bolts (not shown) can be inserted in holes in the thermal control plate 102B and screwed into threaded openings in the backing plate 140B. The thermal control plate 102B is preferably made of a machined metallic material, such as aluminum, an aluminum alloy or the like. The temperature controlled top plate 104B is preferably made of aluminum or an aluminum alloy.

FIGS. 5H-5L show details of the inner electrode 120B. The inner electrode 120B is preferably a plate of high purity (less than 10 ppm impurities) low resistivity (0.005 to 0.02 ohm-cm) single crystal silicon.

Figure 5H:
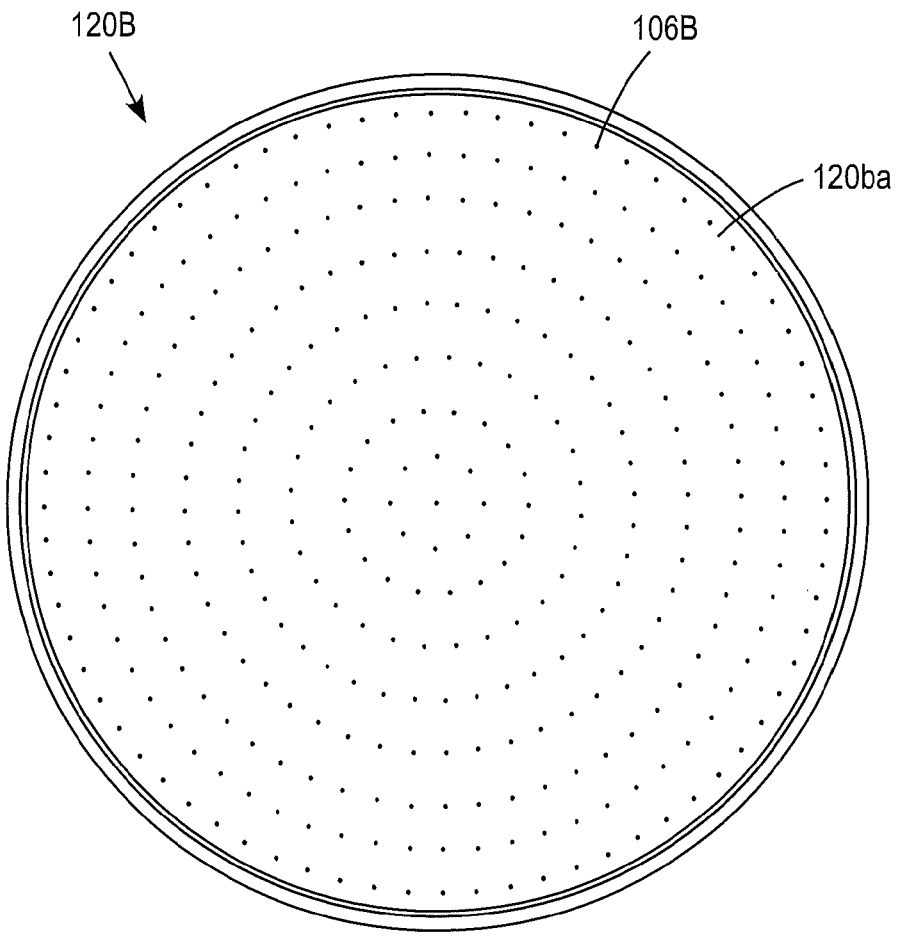
FIG. 5H is a bottom view of an inner electrode in the showerhead electrode assembly in FIG. 1B, showing a plasma exposed surface.

FIG. 5H is a bottom view of the inner electrode 120B, showing the plasma exposed surface 120ba. Gas injection holes 106B of suitable diameter and/or configuration extend from the mounting surface 120bb to the plasma exposed surface 120ba (FIG. 5I) and can be arranged in any suitable pattern. Preferably, the diameter of the gas injection holes 106B is less than or equal to 0.04 inch; more preferably, the diameter of the gas injection holes 106B is between 0.01 and 0.03 inch; further preferably, the diameter of the gas injection holes 106B is 0.02 inch. In the embodiment shown, one gas injection hole is located at the center of the inner electrode 120B; the other gas injection holes are arranged in eight concentric rows with 8 gas injection holes in the first row located about 0.6-0.7 (e.g. 0.68) inch from the center of the electrode, 18 gas injection holes in the second row located about 1.3-1.4 (e.g. 1.34) inch from the center, 28 gas injection holes in the third row located about 2.1-2.2 (e.g. 2.12) inches from the center, 40 gas injection holes in the fourth row located about 2.8-3.0 (e.g. 2.90) inches from the center, 48 gas injection holes in the fifth row located about 3.6-3.7 (e.g. 3.67) inches from the center, 56 gas injection holes in the sixth row located about 4.4-4.5 (e.g. 4.45) inches from the center, 64 gas injection holes in the seventh row located about 5.0-5.1 (e.g. 5.09) inches from the center, and 72 gas injection holes in the eighth row located about 5.7-5.8 (e.g. 5.73) inches from the center. The gas injection holes in each of these rows are azimuthally evenly spaced.

Figure 5I:
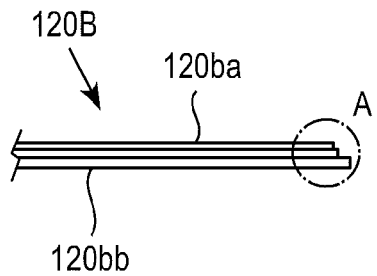
FIG. 5I is a partial cross-sectional view of the inner electrode in FIG. 5H.
Figure 5J:
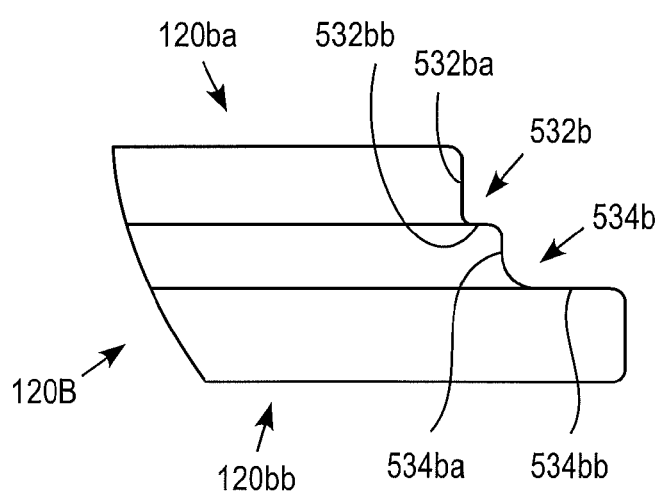
FIG. 5J is an enlarged view of the area A in FIG. 5I.

FIG. 5I is a partial cross-sectional view of the inner electrode 120B along a diameter thereof. The outer circumferential surface includes two steps. FIG. 5J is an enlarged view of the area A in FIG. 5I. An inner step 532b and an outer step 534b extend completely around the inner electrode 120B. In a preferred embodiment, the silicon plate has a thickness of about 0.40 inch and an outer diameter of about 12.5 inches; the inner step 532b has an inner diameter of about 12.00 inches and an outer diameter of about 12.1 inches and; the outer step 534b has an inner diameter of about 12.1 inches and an outer diameter of about 12.5 inches. The inner step 532b has a vertical surface 532ba about 0.13 inch long and a horizontal surface 532bb about 0.07 inch long and the outer step 534b has a vertical surface 534ba about 0.11 inch long and a horizontal surface 534bb about 0.21 inch long. The circular line of intersection between the surfaces 534ba and 534bb is rounded to a radius of about 0.06 inch.

Figure 5K:
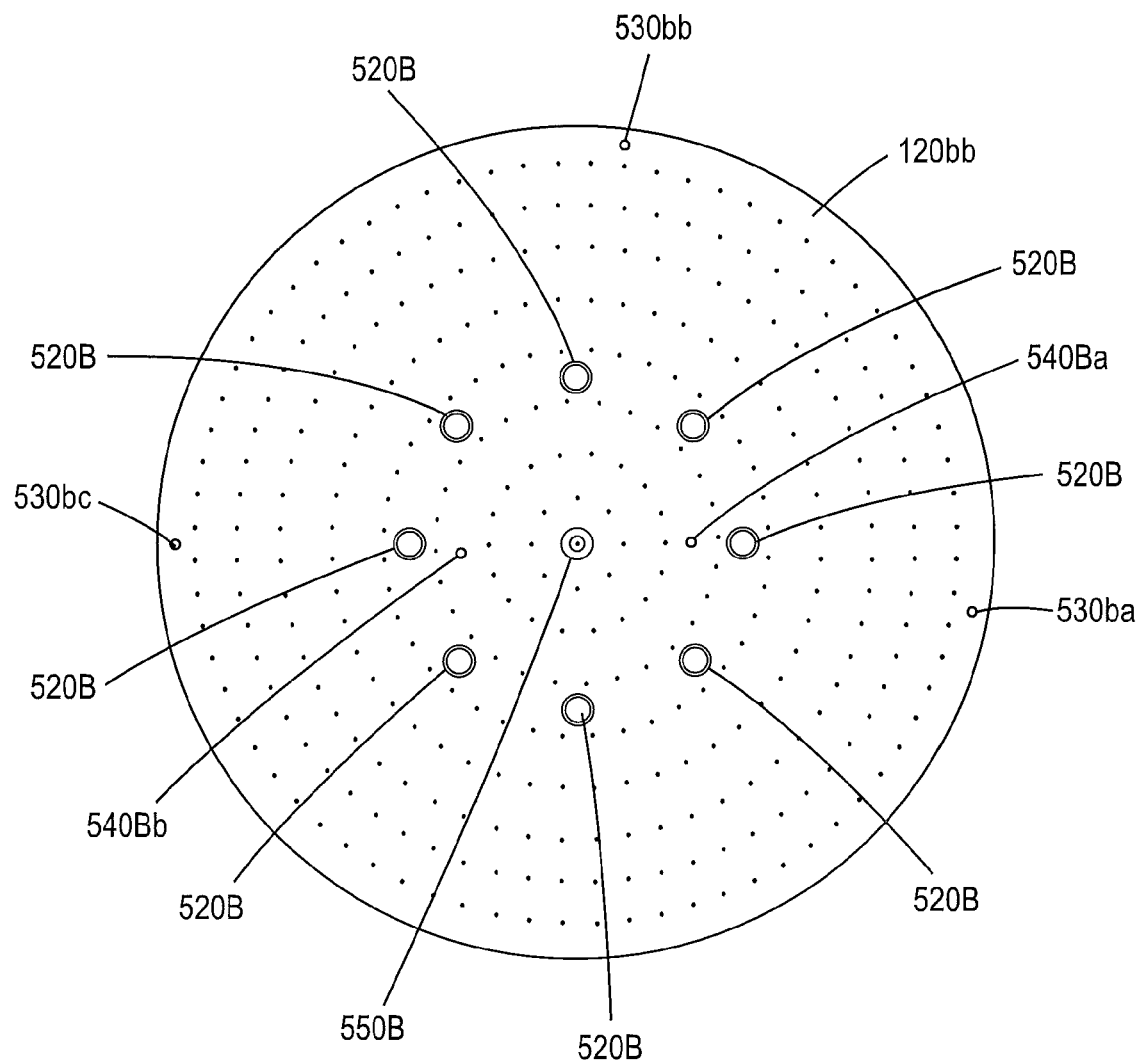
FIG. 5K is a top view of the inner electrode in FIG. 5H, showing a mounting surface.
Figure 5L:
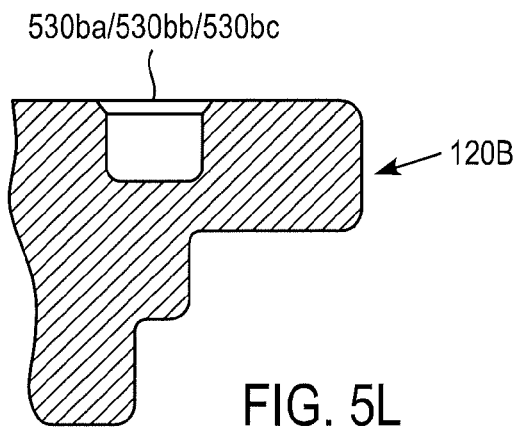
FIG. 5L is a partial cross-sectional view of the inner electrode in FIG. 5K across a hole 530ba, 530bb or 530bc in FIG. 5K.

FIG. 5K is a top view of the inner electrode 120B, showing the mounting surface 120bb. The mounting surface 120bb includes an annular groove 550B (details shown in FIG. 5E) concentric with the inner electrode 120B, the annular groove 550B having an inner diameter of about 0.24 inch, an outer diameter of about 0.44 inch, a depth of at least 0.1 inch, a 45° chamfer of about 0.02 inch wide on the entrance edge, and a fillet of a radius between 0.015 and 0.03 inch on the bottom corner.

The mounting surface 120bb also includes two smooth (unthreaded) blind holes 540Ba and 540Bb configured to receive alignment pins (details shown in FIG. 5F) located at a radius between 1.72 and 1.73 inches from the center of the inner electrode 120B. The blind hole 540Bb is offset by about 175° clockwise from the blind hole 540Ba. The blind holes 540Ba and 540Bb have a diameter between 0.11 and 0.12 inch, a depth of at least 0.2 inch, a 45° chamfer of about 0.02 inch on an entrance edge, and a fillet with a radius of at most 0.02 inch on a bottom corner.

The mounting surface 120bb also includes threaded blind holes 520B arranged in an annular mounting hole zone which divides the mounting surface into a central portion and an outer portion. The mounting hole zone is preferably located on a radius of ¼ to ½ the radius of the inner electrode 120B. In a preferred embodiment, eight 7/16-28 (Unified Thread Standard) or other suitably sized threaded holes 520B, each of which configured to receive a stud/socket assembly 303, are circumferentially spaced apart on a radius between 2.49 and 2.51 inches from the center of the inner electrode 120B and azimuthally offset by about 45° between each pair of adjacent threaded holes 520B. Each of the threaded holes 520B has a total depth of about 0.2 inch, a threaded depth of at least 0.163 inch from the entrance edge, and a 45° chamfer of about 0.03 inch wide on the entrance edge. One of the holes 520B is azimuthally aligned with the hole 540Ba.

The mounting surface 120bb further includes first, second and third smooth (unthreaded) blind holes configured to receive alignment pins (530ba, 530bb and 530bc, respectively, or 530b collectively) (details shown in FIG. 5K) radially aligned at a radius between 6.02 and 6.03 inches from the center of the inner electrode 120B. The holes 530b have a diameter between 0.11 and 0.12 inch, a depth of at least 0.1 inch, a 45° chamfer of about 0.02 inch wide on an entrance edge, and a fillet with a radius of at most 0.02 inch on a bottom corner. The first hole 530ba is offset by about 10° clockwise azimuthally from the unthreaded blind holes 540Ba; the second hole 530bb is offset by about 92.5° counterclockwise azimuthally from the first hole 530ba; the third hole 530bc is offset by about 190° counterclockwise azimuthally from the first hole 530ba.

In the top view of the inner electrode 120B in FIG. 5K (the view of the mounting surface 120bb), a gas injection hole in the first row is azimuthally aligned with the hole 530bc; a gas injection hole in the second row is azimuthally aligned with the hole 530bc; a gas injection hole in the third row is azimuthally offset by about 3.2° counterclockwise from the hole 530bc; a gas injection hole in the fourth row is azimuthally offset by about 4.5° counterclockwise from the hole 530bc; a gas injection hole in the fifth row is azimuthally offset by about 3.75° counterclockwise from the hole 530bc; a gas injection hole in the sixth row is azimuthally offset by about 3.21° counterclockwise from the hole 530bc; a gas injection hole in the seventh row is azimuthally offset by about 2.81° counterclockwise from the hole 530*bc*; a gas injection hole in the eighth row is azimuthally offset by about 2.5° counterclockwise from the hole 530*bc*.

Referring to FIG. 1B, the inner electrode 120B is clamped to the backing plate 140B by a clamp ring 150B engaging the outer step on the lower face and a plurality of cam locks 160B (such as 4 to 8 cam locks) engaging the threaded holes in the upper surface. The clamp ring 150B includes a series of holes which receive fasteners such as bolts (screws) threaded into threaded openings in an underside of the backing plate 140B. To avoid contact of the clamp ring 150B with the step 534*b* on the inner electrode 120B, a compression ring 170B of a stiff material such as a hard polyimide material such as CIRLEX® is compressed between opposed surfaces of the inner electrode 120B and the clamp ring 150B (FIG. 1C).

The cam locks 160B in combination with the clamp ring 150B provide points of mechanical support, improve thermal contact with the backing plate 140B, reduce warping of the inner electrode 120B, and hence reduce processing rate nonuniformity and thermal non-uniformity.

Figure 2C:
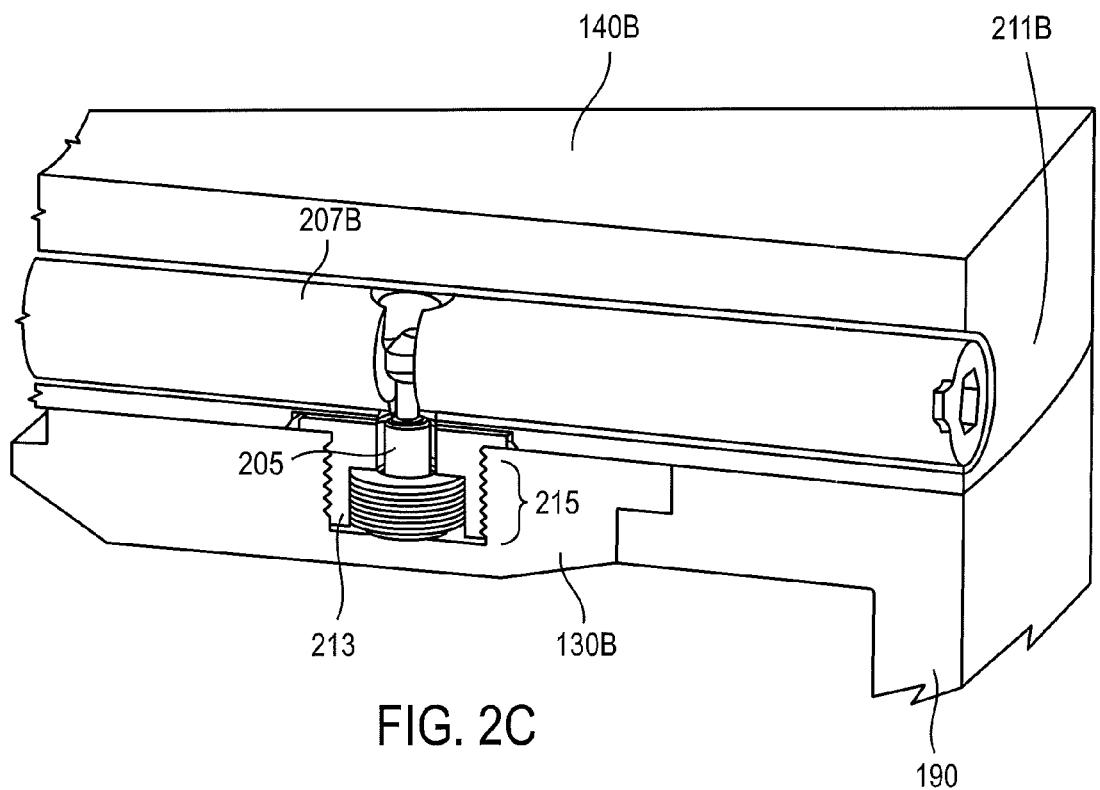
FIG. 2C is a three-dimensional representation of an exemplary cam lock for attaching an outer electrode and an inner electrode in the showerhead electrode assembly shown in FIG. 1B.

In the embodiment shown, the outer electrode 130B is mechanically attached to the backing plate by 8 cam locks and the inner electrode 120B is mechanically attached to the backing plate by another 8 cam locks. FIG. 2C shows a three-dimensional view of an exemplary cam lock including portions of the outer electrode 130B and the backing plate 140B.

Figure 2D:
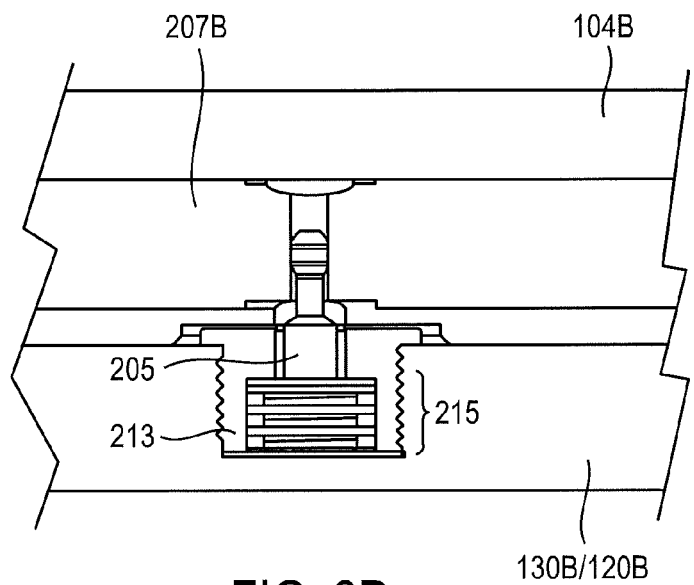
FIG. 2D is a cross-sectional view of the exemplary cam lock of FIG. 2C.

The cam locks as shown in FIGS. 2C and 2D include a stud/socket assembly 303 comprising a stud (locking pin) 205 mounted into a socket 213, as described above and shown in FIG. 3.

To allow simultaneous engagement of cam locks on the inner and outer electrodes, eight elongated cam shafts 207B are mounted into backing plate bores 211B machined into the backing plate 140B. Each cam shaft 207B engages on a stud/socket assembly 303 of one cam lock on the outer electrode 1308 and a stud/socket assembly 303 of one cam lock on the inner electrode 120B.

Referring now to FIG. 2D, a cross-sectional view of the cam lock further exemplifies how the cam lock operates by placing the outer electrode 130B and the inner electrode 120B in close proximity to the backing plate 140B. The stud 205/disc spring stack 215/socket 213 assembly is mounted into the outer electrode 130B and the inner electrode 120B. As shown, the stud/socket assembly may be screwed, by means of external threads on the socket 213 into a threaded hole in the outer electrode 1308 or the inner electrode 120B.

Figure 4C:
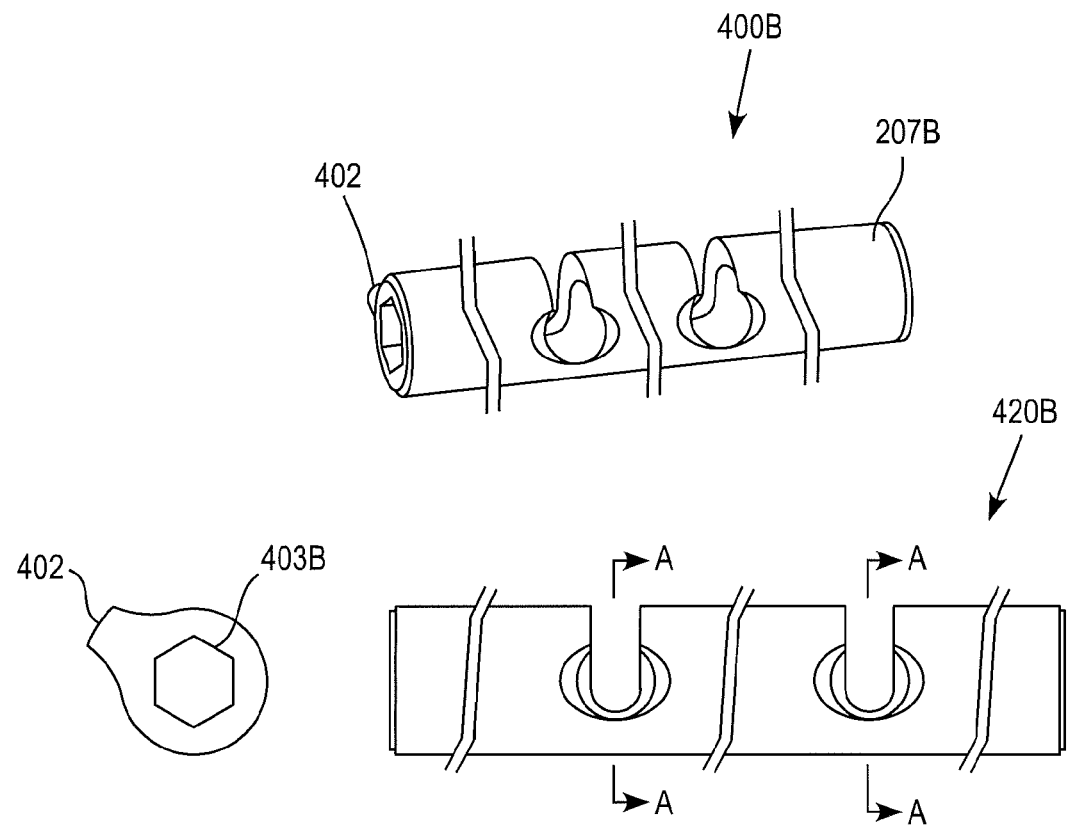
FIG. 4C shows side-elevation and assembly drawings of an exemplary cam shaft used in the cam lock of FIGS. 2C and 2D.

With reference to FIG. 4C, an exploded view 400B of the cam shaft 207B also indicates a keying stud 402 and a hex opening 403B on one end of the cam shaft 207B.

Figure 4D:
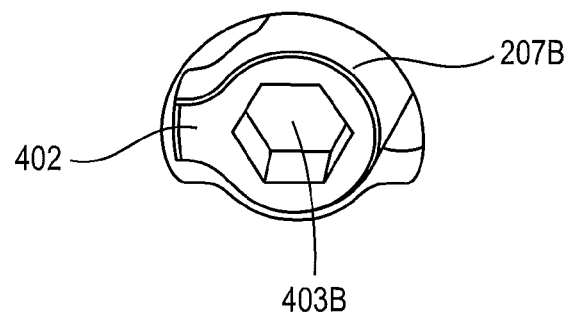
FIG. 4D shows a partial perspective view of the cam shaft in FIG. 4C, mounted in a bore in a backing plate.

For example, with continued reference to FIGS. 4C, 2C and 2D, the cam lock is assembled by inserting the cam shaft 207B into the backing plate bore 211B. The keying stud 402 limits rotational travel of the cam shaft 207B in the backing plate bore 211B by interfacing with a step on an entrance of the bore 211B as shown in FIG. 4D. The cam shaft 207B has two internal eccentric cutouts. One cutout engages an enlarged head of the stud 205 on the outer electrode 1308 and the other cutout engages an enlarged head of the stud 205 on the inner electrode 120B. The cam shaft 207B may first be turned in one direction though use of the hex opening 403B, for example, counter-clockwise, to allow entry of the studs 205 into the cam shaft 207B, and then turned clockwise to fully engage and lock the studs 205. The clamp force required to hold the outer electrode 130B and the inner electrode 120B to the backing plate 140B is supplied by compressing the disc spring stacks 215 beyond their free stack height. As the disc spring stacks 215 compress, the clamp force is transmitted from individual springs in the disc spring stacks 215 to the sockets 213 and through the outer electrode 130B and the inner electrode 120B to the backing plate 140B.

In an exemplary mode of operation, the cam shaft 207B is inserted into the backing plate bore 211B. The cam shaft 207B is rotated counterclockwise to its full rotational travel. The stud/socket assemblies 303 (FIG. 3) lightly torqued into the outer electrode 130B and the inner electrode 120B are then inserted into vertically extending through holes below the horizontally extending backing plate bore 211B such that the heads of the studs 205 engage in the eccentric cutouts in the cam shaft 207B. The outer electrode 130B and the inner electrode 120B are held against the backing plate 140B and the cam shaft 207B is rotated clockwise until the keying pin is limited by the step on the entrance of the bore 211B. The exemplary mode of operation may be reversed to dismount the outer electrode 130B and the inner electrode 120B from the backing plate 140B.

With reference to FIG. 4B, a sectional view A-A of the side-elevation view 420B of the cam shaft 207B of FIG. 4C indicates a cutter path edge 440B by which the head of the stud 205 is fully secured.

Figure 7C:
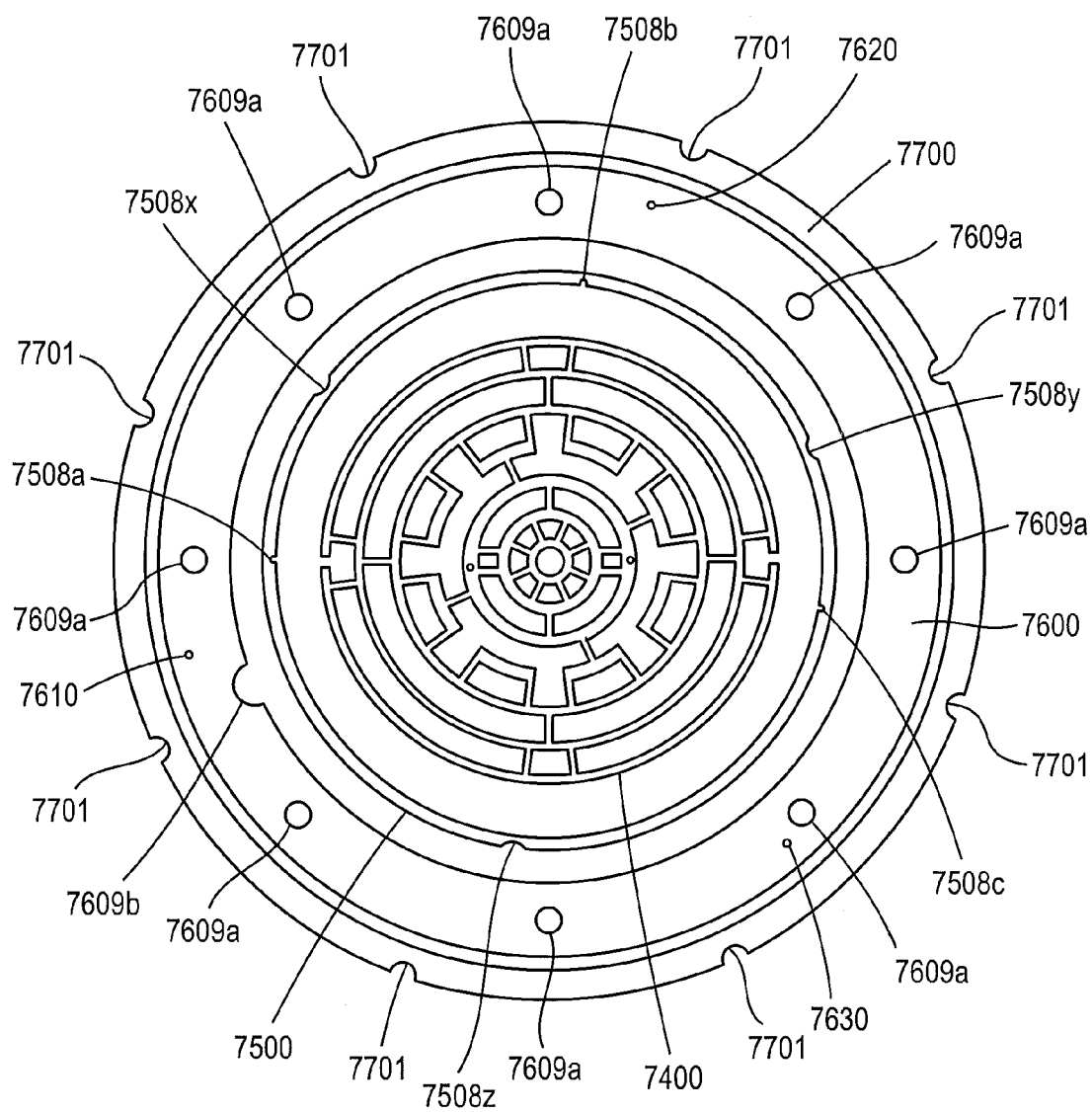
FIG. 7C is a top view of an inner gasket, a first annular gasket, a second annular gasket and a third annular gasket.

FIG. 7C shows a top view of another gasket set. This gasket set comprises an inner gasket 7400 comprising a plurality of concentric rings connected by a plurality of spokes, a first annular gasket 7500 with a plurality of cutouts on an outer and an inner perimeter, a second annular gasket 7600 with a plurality of holes and one cutout, and a third annular gasket 7700 with a plurality of cutouts. The gaskets are preferably electrically and thermally conductive and made of a material without excessive outgas in a vacuum environment, e.g., about 10 to 200 mTorr, having low particle generation, being compliant to accommodate shear at contact points, and free of metallic components that are lifetime killers in semiconductor substrates such as Ag, Ni, Cu and the like. The gaskets can be a silicone-aluminum foil sandwich gasket structure or an elastomer-stainless steel sandwich gasket structure. The gaskets can be an aluminum sheet coated on upper and lower sides with a thermally and electrically conductive rubber compatible in a vacuum environment used in semiconductor manufacturing wherein steps such as plasma etching are carried out. The gaskets are preferably compliant such that they can be compressed when the electrode and backing plate are mechanically clamped together but prevent opposed surfaces of the electrode and backing plate from rubbing against each other during temperature cycling of the showerhead electrode. The gaskets can be manufactured of a suitable material such as "Q-PAD II" available from the Bergquist Company. The thickness of the gaskets is preferably about 0.006 inch. The various features of the gaskets can be knife-cut, stamped, punched, or preferably laser-cut from a continuous sheet. The gasket set is mounted between the backing plate 140B and the inner electrode 120B and outer electrode 130B to provide electrical and thermal contact therebetween.

Figure 7D:
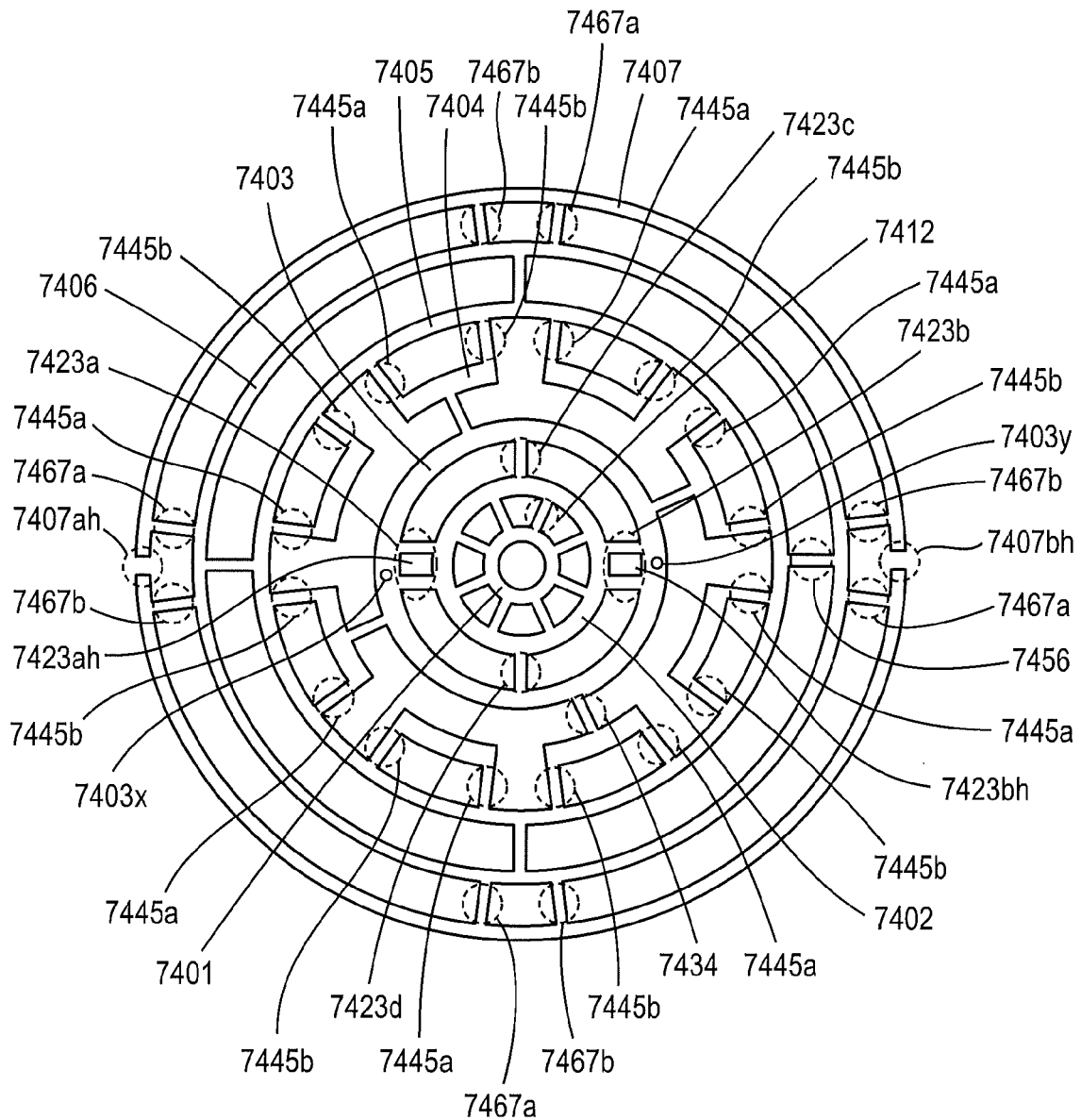
FIG. 7D is an enlarged view of the inner gasket 7400 in FIG. 7C.

FIG. 7D shows the details of the inner gasket 7400. The inner gasket 7400 preferably comprises seven concentric rings interconnected by radial spokes. A first ring 7401 has an inner diameter of at least 0.44 inch (e.g. between 0.62 and 0.65 inch) and an outer diameter of at most 1.35 inches (e.g. between 0.97 and 1.00 inch). The first ring 7401 is connected to a second ring 7402 by eight radially extending and azimuthally evenly spaced spokes 7412. Each spoke 7412 has a width of about 0.125 inch.

The second ring 7402 has an inner diameter of at least 1.35 inches (e.g. between 1.74 and 1.76 inches) and an outer diameter of at most 2.68 inches (e.g. between 2.26 and 2.29 inches). The second ring 7402 is connected to a third ring 7403 by four radially extending and azimuthally evenly spaced spokes. Two of these four spokes 7423a and 7423b oppose each other about the center of the inner gasket 7400 and each has a width of about 0.56 inch and a rounded rectangular opening (7423ah or 7423bh) of about 0.31 inch by about 0.46 inch. The other two of these four spokes 7423c and 7423d oppose each other about the center of the inner gasket 7400 and each has a width of about 0.125 inch. One spoke 7423c is offset azimuthally from one of the spokes 7412 by about 22.5°.

The third ring 7403 has an inner diameter of at least 2.68 inches (e.g. between 3.17 and 3.20 inches) and an outer diameter of at most 4.23 inches (e.g. between 3.71 and 3.74 inches). The third ring is connected to a fourth ring 7404 by four radially extending and azimuthally evenly spaced spokes 7434. Each spoke has a width of about 0.125 inch. One of the spokes 7434 is offset azimuthally by about 22.5° counterclockwise from the spoke 7423c. The third ring 7403 also includes two round holes 7403x and 7403y located at a radial distance between 1.72 and 1.74 inches from the center of the inner gasket 7400. The round holes 7403x and 7403y have a diameter of about 0.125 inch. The round hole 7403x is offset azimuthally by about 95° counterclockwise from the spoke 7423c. The round hole 7403y is offset azimuthally by about 90° clockwise from the spoke 7423c. The round holes 7403x and 7403y are configured to receive alignment pins.

The fourth ring 7404 has an inner diameter of at least 4.23 inches (e.g. between 4.78 and 4.81 inches) and an outer diameter of at most 5.79 inches (e.g. between 5.19 and 5.22 inches). The fourth ring 7404 is connected to a fifth ring 7405 by a set of 8 radially extending and azimuthally evenly spaced spokes 7445a and another set of 8 radially extending and azimuthally evenly spaced spokes 7445b. One of the spokes 7445b is offset azimuthally by about 8.5° counterclockwise from the spoke 7423c. One of the spokes 7445a is offset azimuthally by about 8.5° clockwise from the spoke 7423c. Each spoke 7445a and 7445b has a width of about 0.125 inch. The spokes 7445a and 7445b extend inward radially and separate the fourth ring 7404 into eight arcs each of which has a central angle of about 28°.

The fifth ring 7405 has an inner diameter of at least 5.79 inches (e.g. between 6.35 and 6.37 inches) and an outer diameter of at most 7.34 inches (e.g. between 6.73 and 6.75 inches). The fifth ring 7405 is connected to a sixth ring 7406 by four radially extending and azimuthally evenly spaced spokes 7456. One of the spokes 7456 is offset azimuthally by about 90° from the spoke 7423c. Each the spokes 7456 has a width of about 0.125 inch.

The sixth ring 7406 has an inner diameter of at least 7.34 inches (e.g. between 7.92 and 7.95 inches) and an outer diameter of at most 8.89 inches (e.g. between 8.16 and 8.36 inches). The sixth ring 7406 is connected to a seventh ring 7407 by a set of four radially extending and azimuthally evenly spaced spokes 7467a and another set of four radially extending and azimuthally evenly spaced spokes 7467b. One of the spokes 7467b is offset azimuthally by about 6.4° counterclockwise from the spoke 7423c. One of the spokes 7467a is offset azimuthally by about 6.4° clockwise from the spoke 7423c. Each spoke 7467a and 7467b has a width of about 0.125 inch.

The seventh ring 7407 has an inner diameter of at least 8.89 inches (e.g. between 9.34 and 9.37 inches) and an outer diameter of at most 10.18 inches (e.g. between 9.66 and 9.69 inches). Two cutouts 7407ah and 7407bh with a width of about 0.25 inch separate the seventh ring 7407 into two sections. The cutout 7407ah is offset azimuthally by about 90° counterclockwise from the spoke 7423c. The cutout 7407bh is offset azimuthally by about 90° clockwise from the spoke 7423c.

The first annular gasket 7500 (see FIG. 7C) has an inner diameter of about 11.95 inches and an outer diameter of about 12.47 inches. The first annular gasket 7500 has three small-diameter cutouts 7508a, 7508b and 7508c on its inner perimeter. The cutouts 7508b and 7508c are azimuthally offset from the cutout 7508a by about 92.5° clockwise and about 190° clockwise, respectively. The centers of the cutouts 7508a, 7508b and 7508c are located at a radial distance of about 6.02 inches from the center of the first annular gasket 7500. The cutouts 7508a, 7508b and 7508c face inward and include a semi-circular outer periphery with a diameter of about 0.125 inch and include an inner opening with straight radial edges. The first annular gasket 7500 also has three large-diameter round and outwardly facing cutouts 7508x, 7508y and 7508z on its outer perimeter. The cutouts 7508x, 7508y and 7508z are azimuthally equally spaced and have a diameter of about 0.72 inch. Their centers are located at a radial distance of about 6.48 inches from the center of the first annular gasket 7500. The cutout 7508x is azimuthally offset from the cutout 7508a by about 37.5° clockwise. When installed in the showerhead electrode assembly 100B (as described in details hereinbelow), the cutout 7508a is offset azimuthally by about 90° counterclockwise from the spoke 7423c in the inner gasket 7400.

The second annular gasket 7600 has an inner diameter of about 13.90 inches and an outer diameter of about 16.75 inches. The second annular gasket 7600 has eight circular holes 7609a equally spaced azimuthally. The centers of the holes 7609a are located at a radial distance of about 7.61 inches from the center of the second annular gasket 7600. The holes 7609a have a diameter of about 0.55 inch. When installed in the showerhead electrode assembly 100B (as described in details hereinbelow), one of the holes 7609a is azimuthally aligned with the hole 7403y on the third ring 7403 in the inner gasket 7400. The second annular gasket 7600 also has one round inwardly facing cutout 7609b on the inner perimeter of the outer gasket 7300. The center of this cutout 7609b is located at a distance of about 6.98 inches from the center of the second annular gasket 7600. The cutout 7609b has a diameter of about 0.92 inch. When installed in the showerhead electrode assembly 100B (as described in details hereinbelow), the cutout 7609b is azimuthally offset from the hole 7403y by about 202.5° counterclockwise. The second annular gasket 7600 further has three circular holes 7610, 7620 and 7630 configured to allow tool access. These holes are located at a radial distance of about 7.93 inches and have a diameter of about 0.14 inch. The holes 7610, 7620 and 7630 are offset azimuthally by about 7.5°, about 127.5° and about 252.5° respectively clockwise from the cutout 7609b.

The third annular gasket 7700 has an inner diameter of about 17.29 inches and an outer diameter of about 18.69 inches. The third annular gasket 7700 has eight round outwardly facing cutouts 7701 equally spaced azimuthally on the outer perimeter. The centers of the cutouts 7701 are located at a radial distance of about 9.30 inches from the center of the third annular gasket 7700. The cutouts 7701 have a diameter of about 0.53 inch.

When the inner electrode 120B is installed in the showerhead electrode assembly 100B, an alignment ring 108B (FIG. 1B), two inner alignment pins 109B (not shown in FIG. 1B) and three outer alignment pins (not shown in FIG. 1B) are first inserted into the annular groove 550B, holes 540Ba/540Bb and holes 530b (FIG. 5K), respectively. The inner gasket 7400 is then mounted to the inner electrode 120B. The holes

7403x and 7403y (FIG. 7D) correspond to the inner alignment pins 109B; and the center hole of the inner gasket 7400 corresponds to the alignment ring 108B and the center gas injection hole in the inner electrode 120B. Openings between the seven rings and in the spokes in the inner gasket 7400 correspond to the first row through the sixth row of gas injection holes in the inner electrode 1208. The first annular gasket 7500 is mounted onto the inner electrode 120B. The cutouts 708a, 708b and 708c correspond to the holes 530bc, 530bb and 530ba, respectively. The seventh and eighth rows of gas injection holes fall in the opening between the inner gasket 7400 and the first annular gasket 7500. Eight stud/socket assemblies 303 are threaded into the eight threaded holes 520B to fasten the inner electrode 120B to the backing plate 140B, with the inner gasket 7400 and first annular gasket 7500 sandwiched therebetween. The clamp ring 150B is fastened onto the backing plate 140B by a plurality of bolts threaded into threaded openings in the underside of the backing plate 140B. The stud/socket assemblies 303 and the clamp ring 150B support the inner electrode 120B at a location between the center and outer edge and at the outer edge, respectively, improve thermal contact with the backing plate 140B and reduce warping of the inner electrode 120B caused by temperature cycling during processing of substrates. The second annular gasket 7600 is placed on the outer electrode 130B. The eight holes 7609a correspond to the eight cam locks threaded on the outer electrode 130B. The outer electrode 130B and the inner electrode 120B are fastened against the backing plate 140B by rotating the cam shafts 207B. The C-shaped shroud 190 in FIG. 1B is fastened to the backing plate 140B by a plurality of (preferably eight) cam locks. The third annular gasket 7700 is placed between the shroud 190 and the backing plate 140B. The cutouts 7701 correspond to the cam locks between the shroud 190 and the backing plate 140B.

The rings 7401-7407 and the spokes in the inner gasket 7400 may be arranged in any suitable pattern as long as they do not obstruct the gas injection holes 106B, the cam locks 160B, alignment ring 108B, or alignment pins 109B in the inner electrode 120B.

Figure 7E:
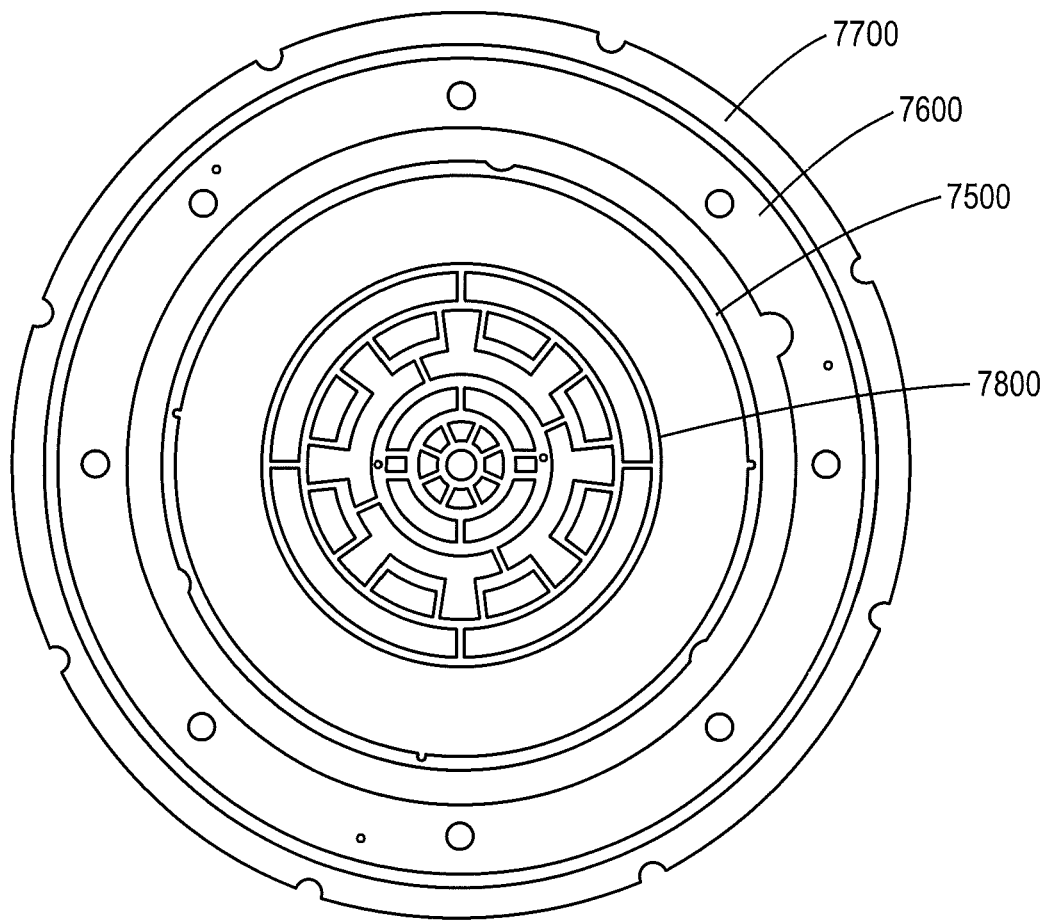
FIG. 7E is a top view of an inner gasket, a first annular gasket, a second annular gasket and a third annular gasket.
Figure 7F:
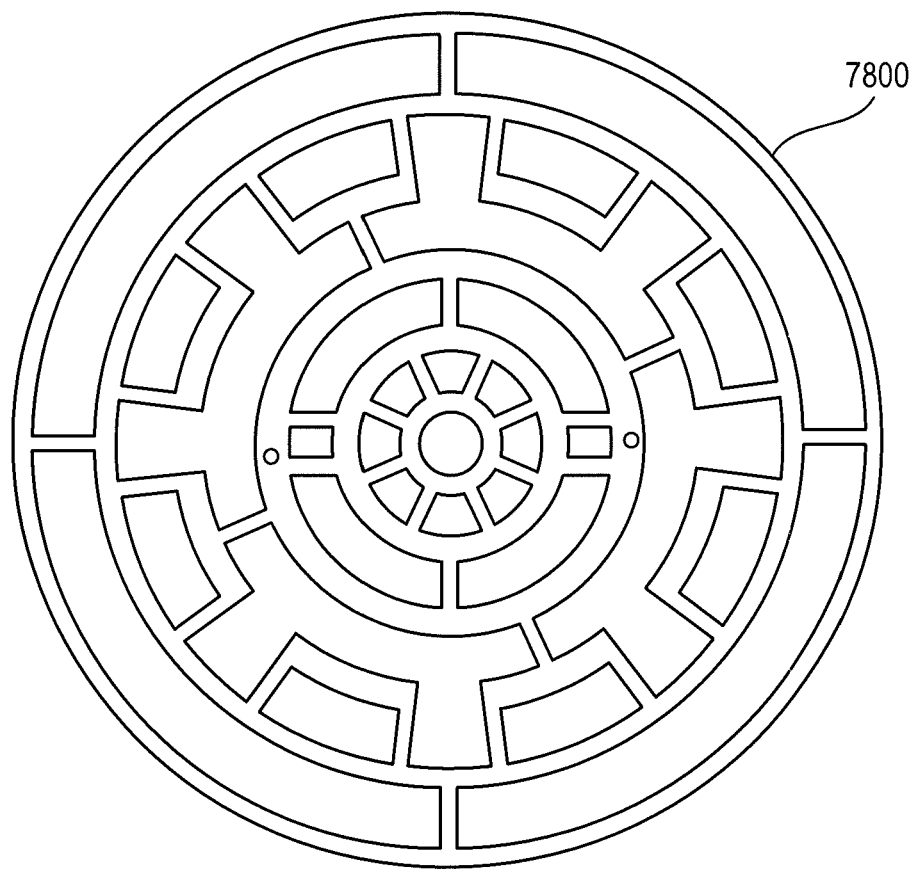
FIG. 7F is an enlarged view of the inner gasket 7800 in FIG. 7E.

FIG. 7E shows a top view of yet another gasket set. This gasket set comprises an inner gasket 7800 comprising a plurality of concentric rings connected by a plurality of spokes, a first annular gasket 7500 with a plurality of cutouts on an outer and an inner perimeter, a second annular gasket 7600 with a plurality of holes and one cutout, and a third annular gasket 7700 with a plurality of cutouts. This gasket set is identical to the gasket set shown in FIGS. 7C and 7D, except that the inner gasket 7800 (as shown in FIG. 7F) does not have the seventh ring and spokes connecting the sixth and the seventh rings.

The rings and the spokes in the inner gasket 7800 may be arranged in any suitable pattern as long as they do not obstruct the gas injection holes 106B, cam locks 160B, alignment ring 108B, or alignment pins 109B in the inner electrode 120B.

While the showerhead electrode assemblies, inner electrodes, outer electrodes and gasket sets have been described in detail with reference to specific embodiments thereof, it will be apparent to those skilled in the art that various changes and modifications can be made, and equivalents employed, without departing from the scope of the appended claims.

We claim:

1. An inner electrode for a showerhead electrode assembly in a capacitively coupled plasma processing chamber, the showerhead electrode assembly comprising a backing plate having gas injection holes extending between upper and lower faces thereof, a clamp ring having an inwardly extending flange, the clamp ring configured to fasten the inner electrode to the backing plate, an outer electrode having an inwardly extending flange and holes configured to receive fasteners which engage openings in the lower face of the backing plate, an alignment ring, a plurality of threaded fasteners which attach the inner electrode to the backing plate, and a plurality of alignment pins; the inner electrode comprising:

a plasma exposed surface on a lower face thereof;
a mounting surface on an upper face thereof;
an inner annular step and an outer annular step, the inner annular step configured to mate with the inwardly extending flange of the outer electrode and the outer annular step configured to mate with the inwardly extending flange of the clamp ring;
a plurality of gas injection holes extending between the plasma exposed surface and the mounting surface thereof and arranged in a pattern matching the gas injection holes in the backing plate, the gas injection holes including a center gas injection hole and concentric rings of gas injection holes;
a plurality of unthreaded blind holes in the mounting surface configured to receive the alignment pins;
an annular groove in the mounting surface configured to receive the alignment ring, the annular groove located between the center gas injection hole and an innermost of the rings of gas injection holes; and
a plurality of threaded blind holes in the mounting surface configured to receive threaded fasteners;
wherein the plurality of threaded blind holes consists of a single circular row of eight equally spaced threaded blind holes located at a radial distance of about 2.4-2.6 inches from the center of the inner electrode, and having a depth of at least 0.15 inch;
wherein the threaded fasteners are configured to attach the mounting surface of the inner electrode to the backing plate such that the mounting surface of the inner electrode and the backing plate are immediately adjacent to each other and the alignment ring and the alignment pins extend between the mounting surface of the inner electrode and the backing plate;
wherein the inner electrode is a planar disk, the inner annular step has a vertical surface and a horizontal surface extending completely around the inner electrode, the outer annular step has a vertical surface and a horizontal surface extending completely around the inner electrode, and the inner electrode has a uniform thickness of about 0.4 inch between the mounting surface and the plasma exposed surface that is surrounded by the vertical surface of the inner annular step.

2. The inner electrode of claim 1, wherein the gas injection holes have a diameter less than or equal to 0.04 inch and are arranged in a pattern with one center gas injection hole at a center of the inner electrode and eight concentric rows of gas injection holes, the first row having eight gas injection holes located at a radial distance of about 0.6-0.7 inch from the center of the inner electrode;

the second row having eighteen gas injection holes located at a radial distance of about 1.3-1.4 inches from the center of the inner electrode;
the third row having twenty-eight gas injection holes located at a radial distance of about 2.1-2.2 inches from the center of the inner electrode;
the fourth row having thirty-eight gas injection holes located at a radial distance of about 2.8-3.0 inches from the center of the inner electrode;

the fifth row having forty-eight gas injection holes located at a radial distance of about 3.6-3.7 inches from the center of the inner electrode;

the sixth row having fifty-eight gas injection holes located at a radial distance of about 4.4-4.5 inches from the center of the inner electrode;

the seventh row having sixty-six gas injection holes located at a radial distance of about 5.0-5.1 inches from the center of the inner electrode;

the eighth row having seventy-four gas injection holes located at a radial distance of about 5.7-5.8 inches from the center of the inner electrode;

the gas injection holes in each row are azimuthally equally spaced.

3. The inner electrode of claim 1, wherein the plurality of threaded blind holes are threaded to a thread size of 1/4-32.

4. The inner electrode of claim 1, wherein the plurality of threaded blind holes are threaded to a thread size of 7-16/28.

5. The inner electrode of claim 1, wherein the plurality of unthreaded blind holes configured to receive the alignment pins comprises a first set of holes and a second set of holes;

the first set of holes comprising two holes: (a) located at a radial distance of about 1.7-1.8 inches from the center of the inner electrode; (b) radially aligned and azimuthally offset by about 180° or about 175° from each other; (c) having a diameter of about 0.10-0.12 inch; (d) having a depth of at least 0.2 inch;

the second set of holes comprising a first hole, a second hole and a third hole: (a) located at a radial distance of about 6.0-6.1 inches from the center of the inner electrode; (b) the first hole azimuthally offset by about 10° clockwise from one hole in the first set; (c) the second and third holes radially aligned with the first hole and azimuthally offset by about 92.5° and about 190° counterclockwise from the first hole; (d) having a diameter of about 0.11-0.12 inch; (e) having a depth of at least 0.1 inch.

6. The inner electrode of claim 1, wherein:

the outer annular step has an inner diameter of about 12.1 inches and the vertical surface of the outer annular step is about 0.11 inch long; the inner annular step has an inner diameter of about 12.0 inches and the vertical surface of the inner annular step is about 0.13 inch long; the annular groove has an outer diameter of about 0.44 inch, an inner diameter of about 0.24 inch and a depth of at least 0.1 inch; the inner electrode is manufactured from a plate of single crystalline or polycrystalline silicon with a resistivity between 0.005 and 0.020 Ohm-cm and a total heavy metal contamination less than 10 parts per million.

7. A showerhead electrode assembly of a capacitively coupled plasma processing chamber comprising: a backing plate, a clamp ring, and an inner electrode;

the backing plate having gas injection holes extending between upper and lower faces; a plurality of unthreaded blind holes in the lower face; an annular groove in the lower face; and a plurality of bores in the lower face, the inner electrode comprising:

a plasma exposed surface on a lower face thereof;

a mounting surface on an upper face thereof;

an inner annular step and an outer annular step, the inner annular step configured to mate with an inwardly extending flange of an outer electrode and the outer annular step mating with an inwardly extending flange of the clamp ring;

a plurality of gas injection holes extending between the plasma exposed surface and the mounting surface of the inner electrode arranged in a pattern matching the gas injection holes in the backing plate, the gas injection holes of the inner electrode and the backing plate including a center gas injection hole and concentric rings of gas injection holes;

a plurality of unthreaded blind holes in the mounting surface of the inner electrode arranged in a pattern matching the plurality of unthreaded blind holes in the lower surface of the backing plate, the plurality of unthreaded blind holes of the inner electrode and the backing plate containing alignment pins;

an annular groove in the mounting surface of the inner electrode opposite the annular groove in the lower surface of the backing plate, the annular grooves of the inner electrode and the backing plate containing an alignment ring, the annular grooves located between the center gas injection hole and an innermost of the rings of gas injection holes;

a plurality of threaded blind holes in the mounting surface of the inner electrode arranged in a pattern matching the plurality of bores of the backing plate, the plurality of threaded blind holes containing threaded fasteners threaded into the threaded blind holes wherein the threaded fasteners extend into the bores of the backing plate and attach the inner electrode to the backing plate;

wherein the plurality of threaded blind holes consists of a single circular row of eight equally spaced threaded blind holes located at a radial distance of about 2.4-2.6 inches from the center of the inner electrode, and having a depth of at least 0.15 inch;

wherein the threaded fasteners attach the mounting surface of the inner electrode to the backing plate such that the mounting surface of the inner electrode and the backing plate are immediately adjacent to each other and the alignment ring and the alignment pins extend between the mounting surface of the inner electrode and the backing plate;

wherein the inner electrode is a planar disk, the inner annular step has a vertical surface and a horizontal surface extending completely around the inner electrode, the outer annular step has a vertical surface and a horizontal surface extending completely around the inner electrode, and the inner electrode has a uniform thickness of about 0.4 inch between the mounting surface and the plasma exposed surface that is surrounded by the vertical surface of the inner annular step; and a gasket set comprising:

an inner gasket mounted on the mounting surface of the inner electrode, the inner gasket comprising a plurality of concentric flat rings connected by a plurality of spokes; and a first annular gasket surrounding and concentric with the inner gasket and mounted on the mounting surface of the inner electrode, the first annular gasket comprising a flat annular ring having a plurality cutouts;

wherein the gasket set accommodates the gas injection holes, alignment pin holes, the alignment ring grooves and the threaded holes of the inner electrode and the backing plate.

8. The showerhead electrode assembly of claim 7, further comprising:

the outer electrode having an inwardly extending flange mating with the inner annular step of the inner electrode; the outer electrode attached to the backing plate by cam locks comprising studs with enlarged heads mounted on the outer electrode and rotatable cam shafts mounted in the backing plate, the rotatable cam shafts having eccentric cutouts which engage enlarged heads of the studs.

9. The showerhead electrode assembly of claim 8, wherein the threaded blind holes are located on a radius of ¼ to ½ the radius of the inner electrode and the threaded fasteners comprise sockets threadedly engaged with the threaded blind holes, the sockets including studs with enlarged heads which engage eccentric cutouts in the rotatable cam shafts such that a stud mounted on the inner electrode and a stud mounted on the outer electrode are simultaneously engaged in cutouts in one of the rotatable camshafts.

10. A method of assembling the showerhead electrode assembly of claim 9, comprising:
   inserting the alignment ring into the annular groove on the mounting surface of the inner electrode;
   inserting alignment pins into the plurality of unthreaded blind holes on the mounting surface of the inner electrode;
   mounting an inner gasket and a first annular gasket on the mounting surface of the inner electrode;
   fastening the clamp ring around the outer step of the inner electrode onto the backing plate with a plurality of bolts;
   placing a second annular gasket on the upper surface of the outer electrode;
   fastening the outer electrode with the outer gasket mounted thereon and the inner electrode to the backing plate with cam locks.

11. The showerhead electrode assembly of claim 8, wherein the gasket set further comprises a second annular gasket surrounding and concentric with the first annular gasket and mounted on the outer electrode, the second annular gasket comprising a flat annular ring having a plurality cutouts.

12. The showerhead electrode assembly of claim 11, further comprising an annular shroud secured to the backing plate, and the gasket set comprising a third annular gasket surrounding and concentric with the second annular gasket and mounted on the annular shroud, the third annular gasket comprising a flat annular ring having a plurality cutouts.

* * * * *